(12) United States Patent
Connolly et al.

(10) Patent No.: US 11,143,594 B2
(45) Date of Patent: Oct. 12, 2021

(54) METHODS AND APPARATUS FOR SAMPLE MEASUREMENT

(71) Applicant: Quantum Diamond Technologies Inc., Somerville, MA (US)

(72) Inventors: Colin B. Connolly, Cambridge, MA (US); Giles P. Blaney, Wenham, MA (US); Akim Lennhoff, Cambridge, MA (US); Jeffrey D. Randall, Westford, MA (US); Harald Quintus-Bosz, Sudbury, MA (US); Stuart E. Schechter, Newton, MA (US); Kenneth A. Ritsher, Lowell, MA (US); Hooman Hosseinkhannazer, Edmonton (CA); Graham McKinnon, Edmonton (CA)

(73) Assignee: Quantum Diamond Technologies Inc., Somerville, MA (US)

(*) Notice: Subject to any disclaimer, the term of this patent is extended or adjusted under 35 U.S.C. 154(b) by 35 days.

(21) Appl. No.: 16/633,488

(22) PCT Filed: Jul. 30, 2018

(86) PCT No.: PCT/US2018/044409
§ 371 (c)(1),
(2) Date: Jan. 23, 2020

(87) PCT Pub. No.: WO2019/027917
PCT Pub. Date: Feb. 7, 2019

(65) Prior Publication Data
US 2021/0131966 A1 May 6, 2021

Related U.S. Application Data

(60) Provisional application No. 62/539,241, filed on Jul. 31, 2017.

(51) Int. Cl.
*G01N 21/64* (2006.01)

(52) U.S. Cl.
CPC ..... *G01N 21/6452* (2013.01); *G01N 21/6456* (2013.01); *G01N 21/6489* (2013.01); *G01N 2021/6482* (2013.01)

(58) Field of Classification Search
CPC ........... G01N 21/6452; G01N 21/6456; G01N 21/6489; G01N 21/6486;
(Continued)

(56) References Cited

U.S. PATENT DOCUMENTS

| 4,279,617 A | 7/1981 | Masson et al. |
| 4,628,037 A | 12/1986 | Chagnon et al. |

(Continued)

FOREIGN PATENT DOCUMENTS

| EP | 0430371 A2 | 6/1991 |
| JP | 2016/188828 A | 11/2016 |

(Continued)

OTHER PUBLICATIONS

International Search Report and Written Opinion for International Application No. PCT/US2020/058664 dated Feb. 25, 2021.
(Continued)

*Primary Examiner* — Hoa Q Pham
(74) *Attorney, Agent, or Firm* — Foley Hoag LLP; Rajesh Vallabh

(57) ABSTRACT

The present application discloses a sensor system that includes a sensor having a sensor surface, a sample cartridge including one or more flexible membranes and a membrane frame, the membrane frame including one or more openings covered by the one or more flexible membranes defining one or more wells for holding one or more samples, the flexible membrane having a sample side supporting the sample and an opposite sensor side, the sample cartridge being remov-
(Continued)

ably insertable in the sensor system such that the sensor side of the flexible membrane is positioned above and faces the sensor surface, a displacement mechanism that can be actuated to displace the flexible membrane toward the sensor surface such that the sample is moved to a position closer to the sensor surface, and an optical imaging system that detects light emitted from the sensor. Disclosed also are a cartridge cassette and a method of use.

28 Claims, 28 Drawing Sheets

(58) Field of Classification Search
CPC .... G01N 2021/6482; G01N 2201/0245; B01L 2200/04; B01L 2300/044
USPC ........ 356/445–448, 301–326, 246; 422/68.1, 422/82.05, 82.08; 435/287.2, 287.1, 4; 204/403.06, 415, 418
See application file for complete search history.

(56) References Cited

U.S. PATENT DOCUMENTS

| | | | |
|---|---|---|---|
| 4,695,392 A | 9/1987 | Whitehead et al. | |
| 5,145,784 A | 9/1992 | Cox et al. | |
| 5,547,555 A | 8/1996 | Schwartz et al. | |
| 5,648,124 A | 7/1997 | Sutor | |
| 5,998,224 A | 12/1999 | Rohr et al. | |
| 6,050,138 A | 4/2000 | Lynch et al. | |
| 6,097,790 A | 8/2000 | Hasegawa et al. | |
| 6,178,033 B1 | 1/2001 | Ford et al. | |
| 6,231,643 B1 | 5/2001 | Pasic et al. | |
| 6,602,714 B1 | 8/2003 | Tagge et al. | |
| 6,896,850 B2 | 5/2005 | Subramanian et al. | |
| 7,086,288 B2 | 8/2006 | Lee et al. | |
| 7,279,286 B2 | 10/2007 | Kannt et al. | |
| 7,474,180 B2 | 1/2009 | Bintoro et al. | |
| 7,489,593 B2 | 2/2009 | Nguyen-Dinh et al. | |
| 7,635,571 B2 | 12/2009 | Ullman et al. | |
| 7,863,035 B2 | 1/2011 | Clemens et al. | |
| 8,142,892 B2 | 3/2012 | Rida | |
| 8,193,808 B2 | 6/2012 | Fu et al. | |
| 8,236,574 B2 | 8/2012 | Duffy et al. | |
| 8,520,211 B2 | 8/2013 | Schleipen et al. | |
| 8,670,524 B2 | 3/2014 | Mann et al. | |
| 8,691,557 B2 | 4/2014 | Sooryakumar et al. | |
| 8,697,435 B2 | 4/2014 | Heil et al. | |
| 8,846,415 B2 | 9/2014 | Duffy et al. | |
| 8,989,354 B2 | 3/2015 | Davis et al. | |
| 9,435,791 B2 | 9/2016 | Acosta et al. | |
| 9,766,181 B2 | 9/2017 | Englund et al. | |
| 9,797,817 B2 | 10/2017 | McNaughton et al. | |
| 10,845,449 B2 | 11/2020 | Connolly et al. | |
| 2002/0025576 A1 | 2/2002 | Northrup et al. | |
| 2005/0053525 A1 | 3/2005 | Segal et al. | |
| 2006/0252031 A1 | 11/2006 | Abbott et al. | |
| 2007/0012094 A1 | 1/2007 | Degertekin et al. | |
| 2007/0103697 A1 | 5/2007 | Degertekin | |
| 2008/0014442 A1 | 1/2008 | Rida | |
| 2008/0108122 A1 | 5/2008 | Paul et al. | |
| 2008/0191688 A1 | 8/2008 | Kahlman et al. | |
| 2009/0134481 A1* | 5/2009 | Sengupta ............ H01L 31/0203 257/415 |
| 2009/0165876 A1 | 7/2009 | Atkin et al. | |
| 2010/0193398 A1 | 8/2010 | Marsh et al. | |
| 2011/0062957 A1 | 3/2011 | Fu et al. | |
| 2011/0065209 A1 | 3/2011 | Heil et al. | |
| 2011/0124985 A1 | 5/2011 | Meurville et al. | |
| 2011/0170108 A1 | 7/2011 | Degertekin | |
| 2012/0115214 A1 | 5/2012 | Battrell et al. | |
| 2012/0170134 A1 | 7/2012 | Bolis et al. | |
| 2012/0182548 A1 | 7/2012 | Harb et al. | |
| 2012/0301893 A1* | 11/2012 | Siciliano ............... B01L 3/5023 435/7.1 |
| 2013/0122485 A1 | 5/2013 | Hong | |
| 2013/0122517 A1 | 5/2013 | Henzler et al. | |
| 2015/0184235 A1 | 7/2015 | Reda et al. | |
| 2015/0374250 A1 | 12/2015 | Hatano et al. | |
| 2016/0282427 A1 | 9/2016 | Heidmann | |
| 2016/0356863 A1 | 12/2016 | Boesch et al. | |
| 2017/0234941 A1 | 8/2017 | Hatano et al. | |
| 2017/0316487 A1 | 11/2017 | Mazed | |
| 2019/0331674 A1 | 10/2019 | Connolly et al. | |
| 2019/0361051 A1* | 11/2019 | Vettori ............... G01R 1/07314 |

FOREIGN PATENT DOCUMENTS

| | | |
|---|---|---|
| WO | WO-2008030960 A2 | 3/2008 |
| WO | WO-2010051580 A1 | 5/2010 |
| WO | WO-2011/026030 A1 | 3/2011 |
| WO | WO-2011133632 A1 | 10/2011 |
| WO | WO-2013004852 A2 | 1/2013 |
| WO | WO-2013059404 A1 | 4/2013 |
| WO | WO-2014/108185 A1 | 7/2014 |
| WO | WO-2015/199940 A1 | 12/2015 |
| WO | WO-2016/118791 A1 | 7/2016 |
| WO | WO-2018075913 A1 | 4/2018 |
| WO | WO-2018119367 A1 | 6/2018 |

OTHER PUBLICATIONS

Steen et al., "Magnetic interactions between nanoparticles," Beilstein Journal of Nanotechnology, 1: 182-190 (2010).
Lai et al., "Influence of a static magnetic field on the photoluminescence of an ensemble of nitrogen-vacancy color centers in a diamond single-crystal," Applied Physics Letter, 95: Article 133101 (2009).
Shi et al., "Sensing and atomic-scale structure analysis of single nuclear-spin clusters in diamond," Nature Physics, 10: 21-25 (2013).
Glenn et al., "Single-cell magnetic imaging using a quantum diamond microscope," Nature Methods, 12:736-738 (2015).
Hong et al., "Nanoscale magnetometry with NV centers in diamond," MRS Bulletin, 38:155-161 (2013).
International Search Report and Written Opinion for International Application No. PCT/US2018/044409 dated Nov. 16, 2018.
Le Sage et al., "Optical magnetic imaging of living cells," Nature, 496:486-489 (2013).
Pham, "Magnetic Field Sensing with Nitrogen-Vacancy Color Centers in Diamond," Harvard University, Doctoral Dissertation (2013).
Rondin et al., "Magnetometry with nitrogen-vacancy defects in diamond," Reports on Progress in Physics, 77(5):56503 (2014).
Schonfeld, "Optical readout of single spins for quantum computing and magnetic sensing," Fachbereich Physik der Freien Universitat Berlin eingereichte Dissertation 1-143 (2011).
Taylor et al., "High-sensitivity diamond magnetometer with nanoscale resolution," Nature Physics, 4:810-816 (2008).
Extended European Search Report for EP Application No. 17884358.7 dated Jun. 22, 2020.
Extended European Search Report for ER Application No. 18842062.4 dated Mar. 29, 2021.

* cited by examiner

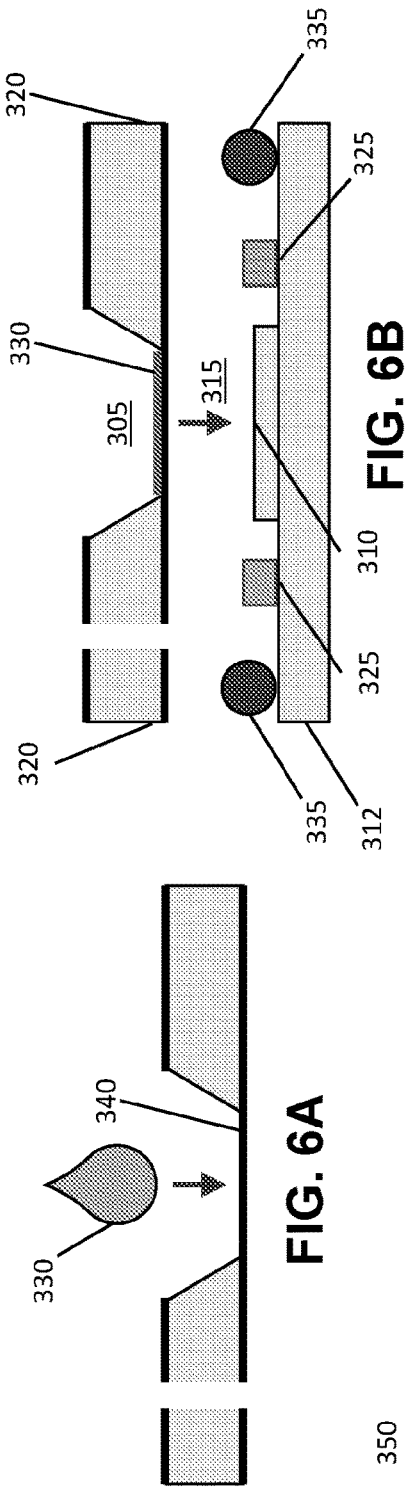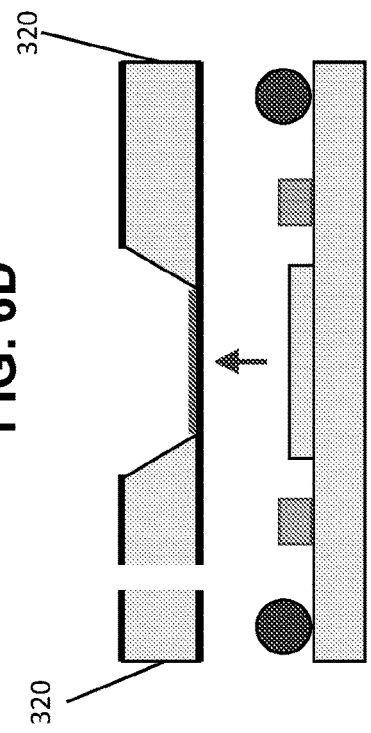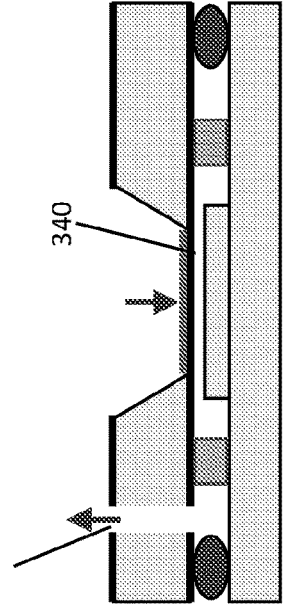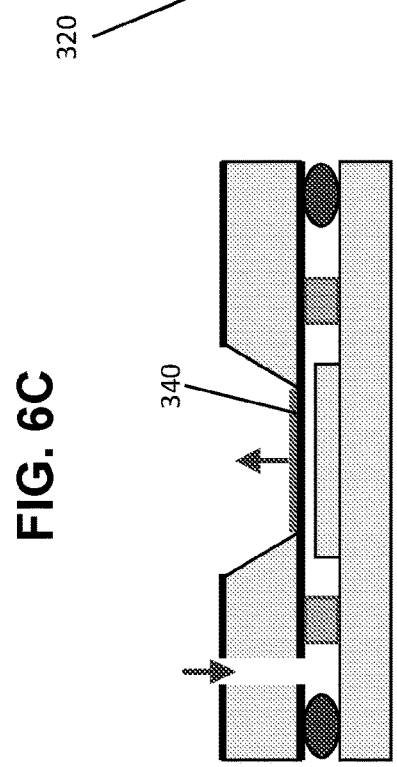

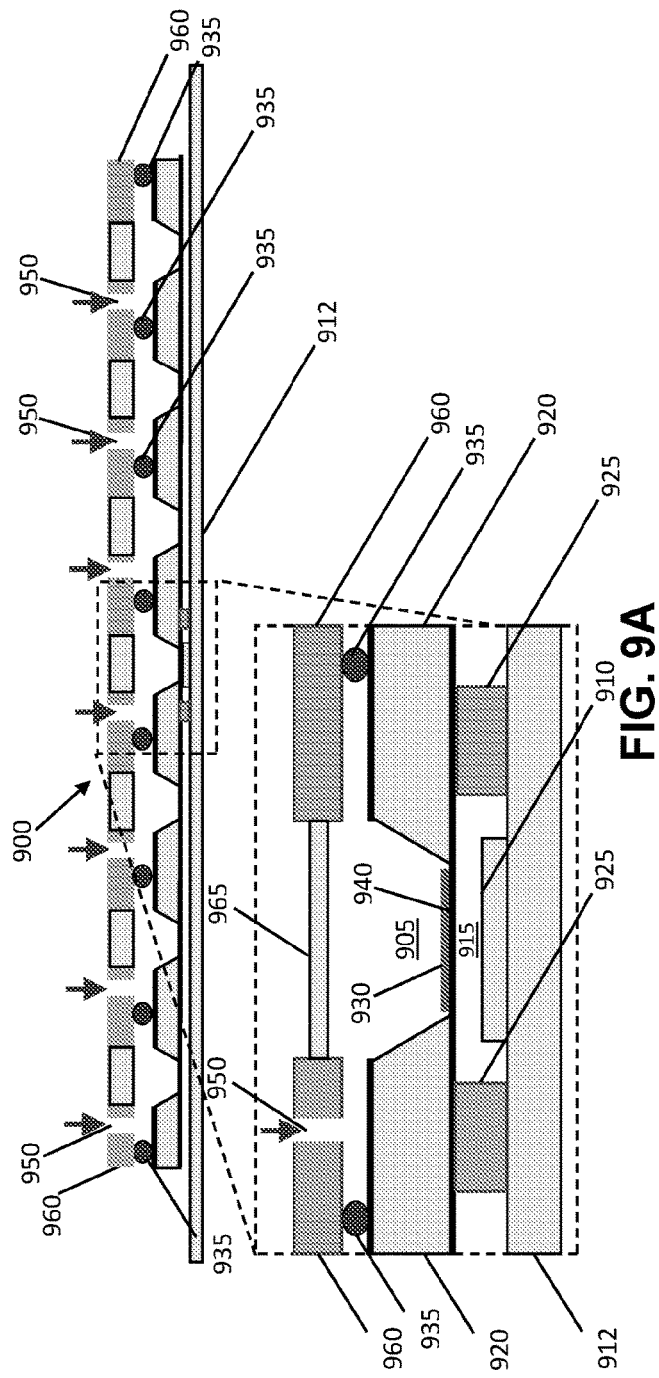
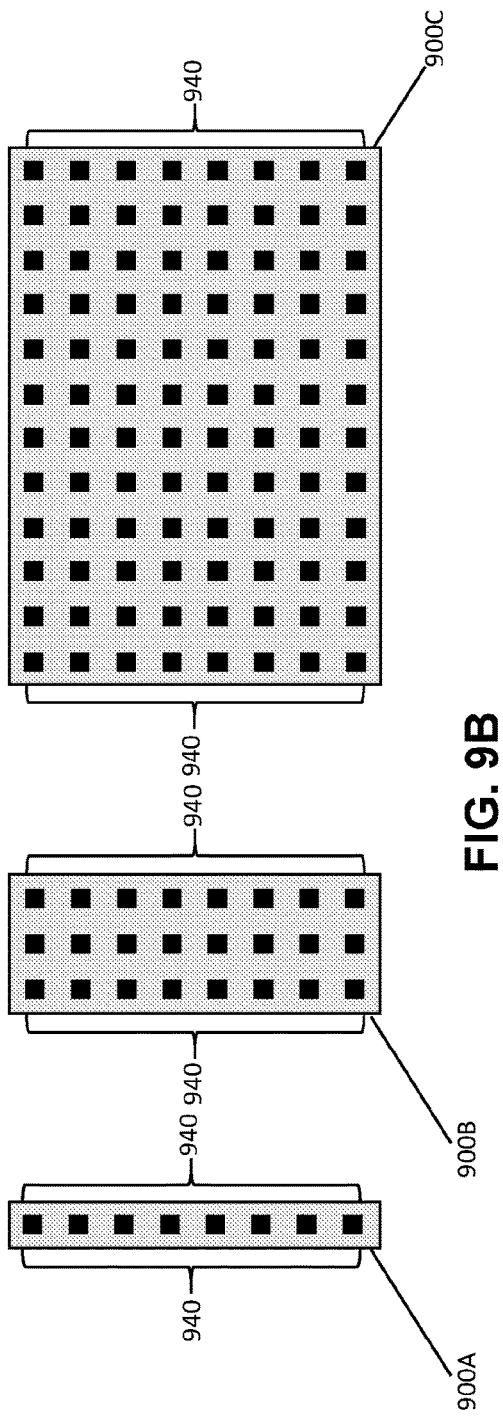
FIG. 9A
FIG. 9B

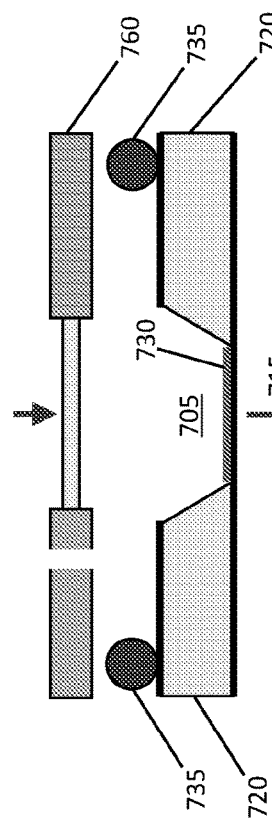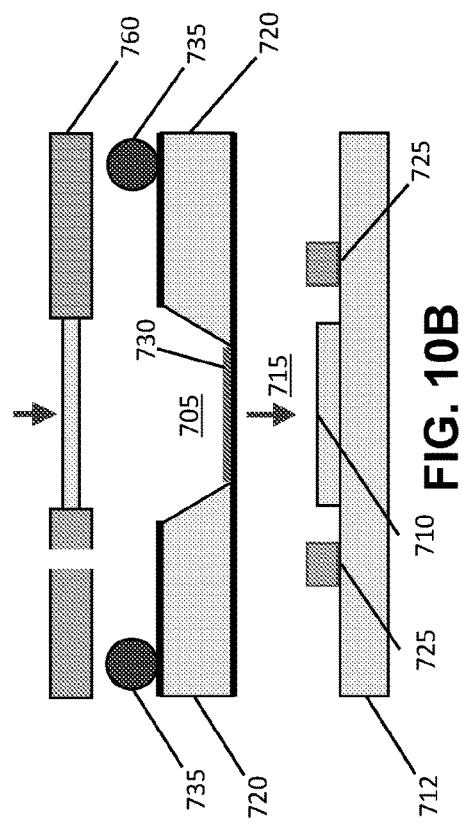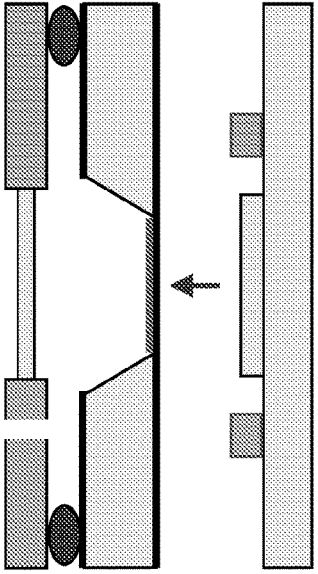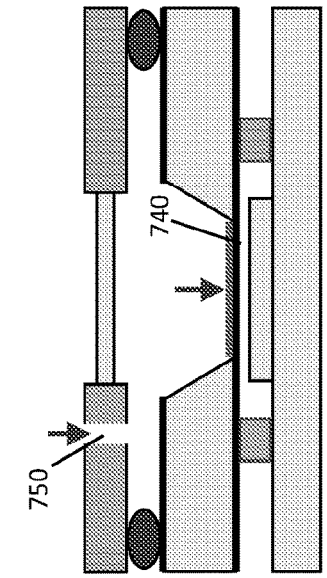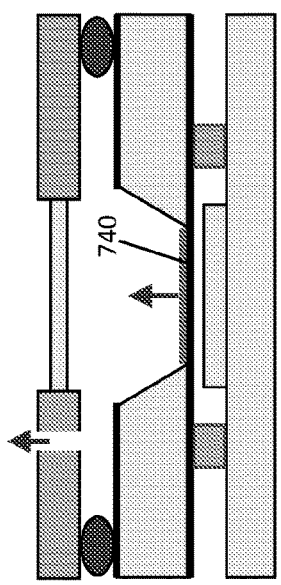

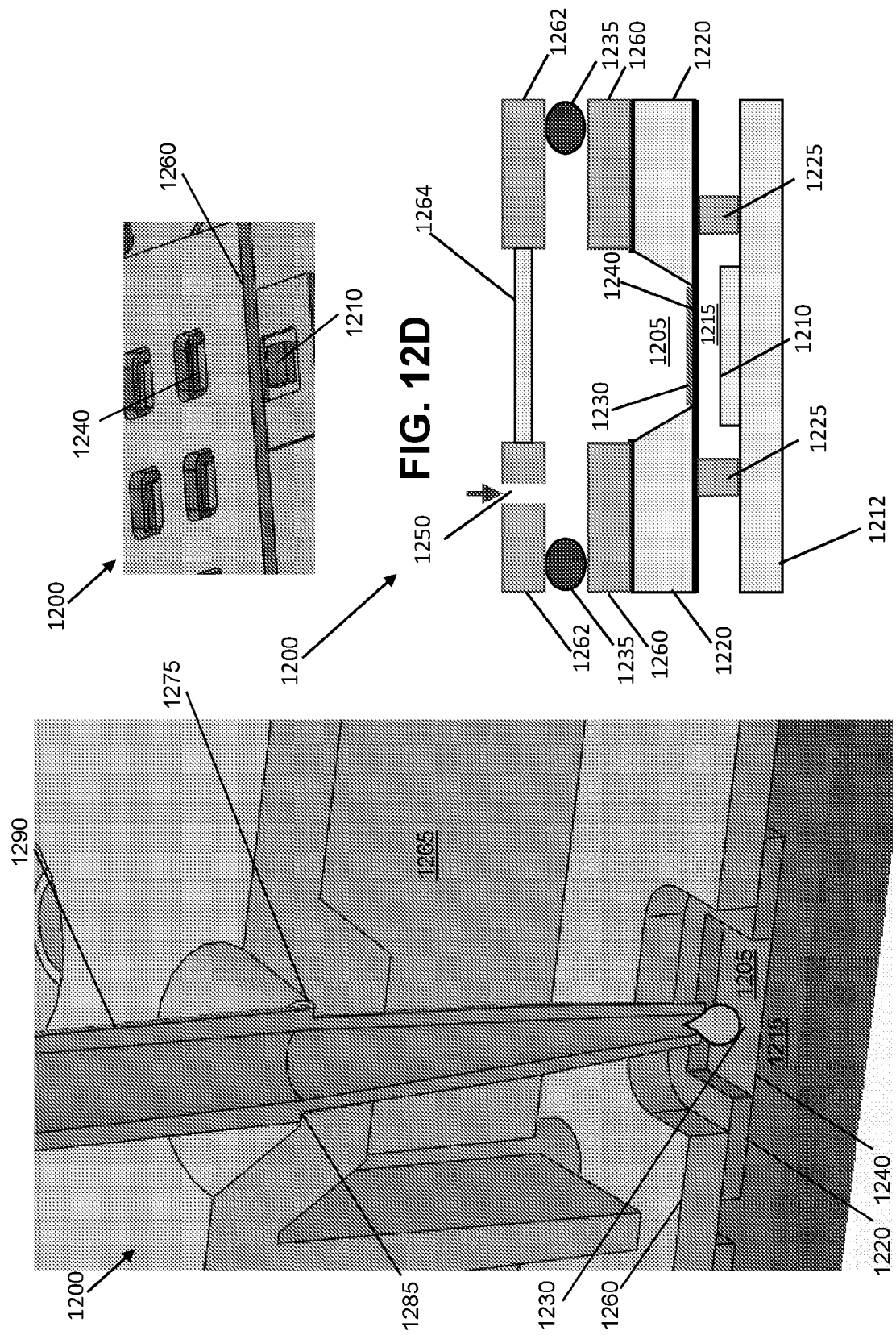

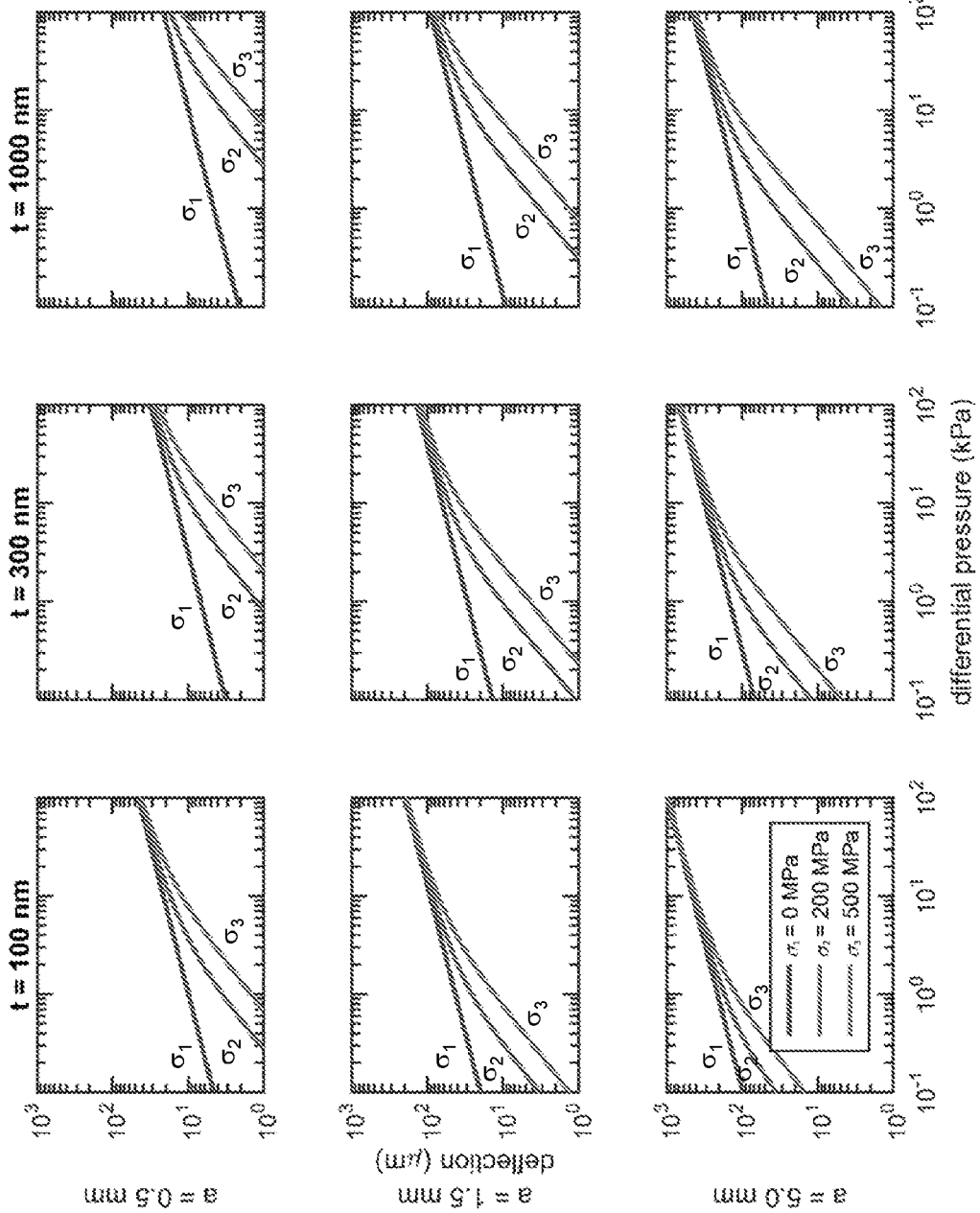

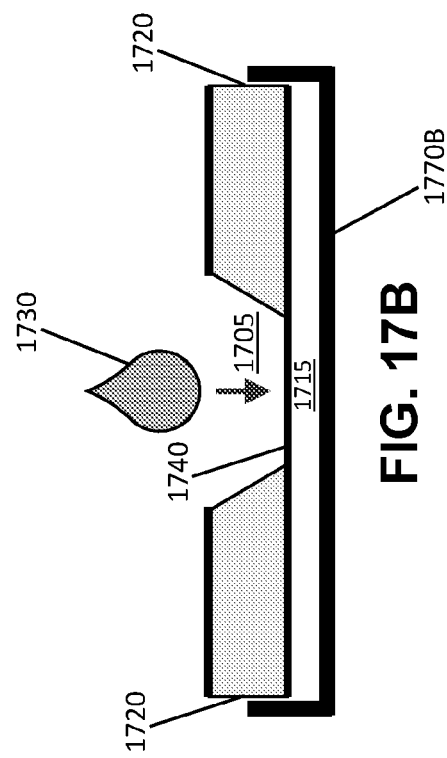
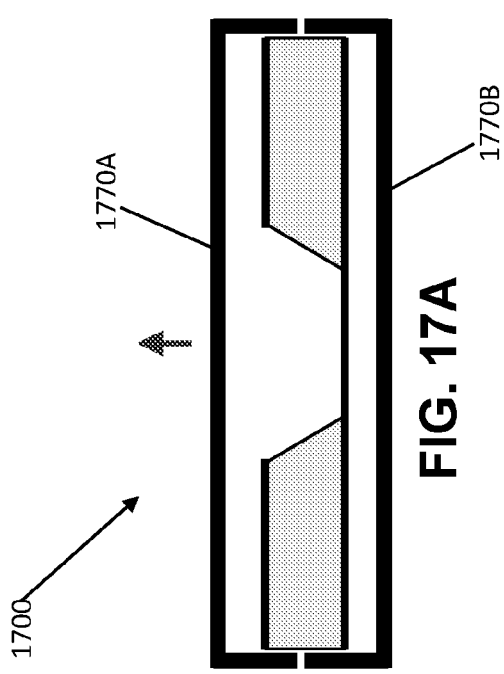
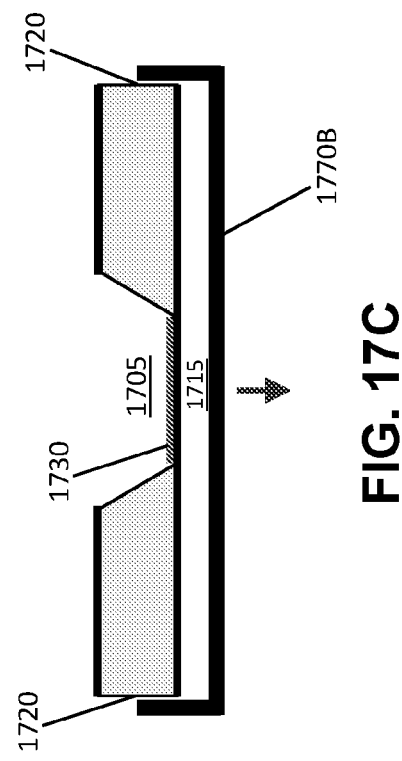
FIG. 17A
FIG. 17B
FIG. 17C

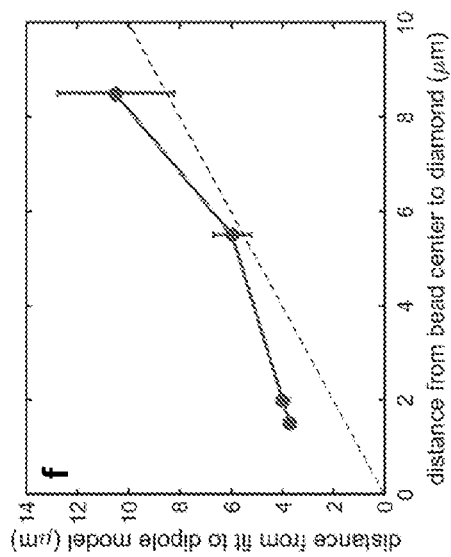
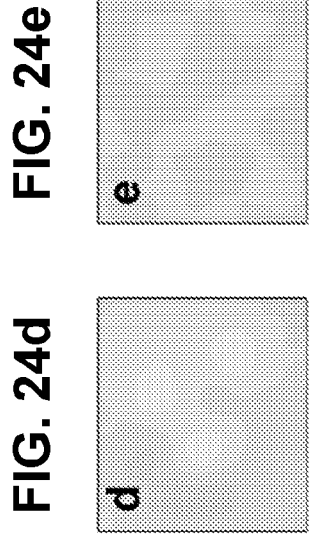
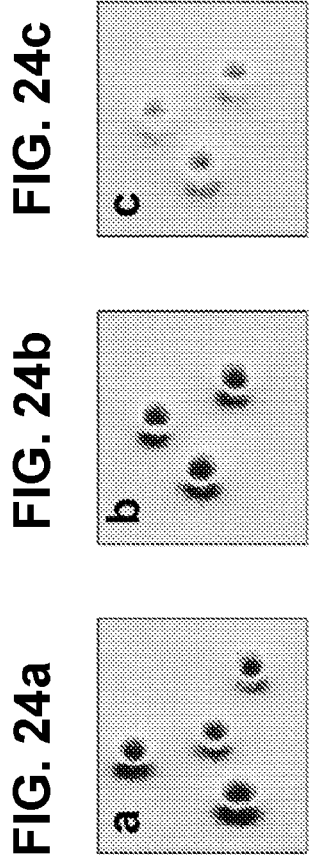
FIG. 24a  FIG. 24b  FIG. 24c  FIG. 24d  FIG. 24e  FIG. 24f

METHODS AND APPARATUS FOR SAMPLE MEASUREMENT

CROSS REFERENCE TO RELATED APPLICATION

This application is a national stage application filed under 35 U.S.C. § 371 of International Patent Application No. PCT/US18/44409 filed on Jul. 30, 2018 entitled METHODS AND APPARATUS FOR SAMPLE MEASUREMENT, which claims the benefit of U.S. Provisional Patent Application No. 62/539,241 filed on Jul. 31, 2017, entitled METHODS AND APPARATUS FOR SAMPLE MEASUREMENT. The contents of the above applications are incorporated herein by reference in their entirety.

BACKGROUND

A number of sensing applications benefit from increased signal strength and greater spatial resolution by having the sample to be measured brought in closer proximity to a sensing surface. An example is the measurement of magnetic fields from microscopic magnetic structures, such as samples containing small magnetic particles or small magnetic domains in a solid material. The magnetic field near the sample varies spatially on a scale similar to that of the magnetic structure, while the field measured at a standoff distance from the sample varies instead on a scale similar to the standoff distance. In addition, the magnitude of the magnetic field produced by an individual component magnetic dipole in the sample decreases strongly with the standoff distance, weakening the available magnetic signal. Thus, it would be advantageous to bring the sample in close proximity to the sensor.

Other sensing applications also benefit from close proximity to a sensing surface. These can include: (1) total internal reflection measurements exploiting surface plasmon resonance at a reflective interface, which may depend sensitively on the presence of target molecules at distances from the interface smaller than the optical wavelength; (2) thermometry of localized sources of heating and cooling, such as optically or electrically stimulated particles; and (3) microscopic electric field sensing, which is similar to magnetic field sensing in its dependence on standoff distance from a microscopic signal source.

These and other proximity-dependent sensing applications may deposit the sample directly onto a sensing surface in order to minimize the standoff distance. This sensing surface may be a regular or random array of individual sensing elements, which may be used to construct an image of the measured quantity over a region of the sensing surface.

Example of a Sensing Technology: Wide-Field Magnetic Imaging with NV Centers in Diamond An example of a sensor technology that is dependent on proximity to the sample is wide-field magnetic imaging with nitrogen-vacancy (NV) centers in diamond. NV centers exhibit magnetic resonance behavior that depends sensitively on the vector magnetic field and which may be read out optically using light emitted from the NV centers and collected in the far field with imaging optics. This technology may be used to construct high-resolution maps of the vector magnetic field across a wide field of view on the diamond surface.

NV centers result from the substitution of two adjacent carbon atoms in the diamond lattice with a nitrogen atom and an empty site (a vacancy). While NV centers can occur with different electronic charge states, the discussion here refers to the negatively-charged NV center. FIGS. 1A and 1B illustrate an NV center structure and energy level diagram. Each NV center has an electronic spin and a strong magnetic moment that provides sensitivity to magnetic fields. In a nonzero magnetic field B, the states with spin projection $m_s=+1$ and $m_s=-1$ shift in energy. NV centers can be engineered in a thin layer at the diamond sensor surface.

NV magnetic sensing may be performed by observing spin-dependent fluorescence from NV sensors. When excited with green light from the ground electronic state, NV centers emit red fluorescence. Due to excited state decay paths that do not conserve spin (FIG. 1A), and to a long spin coherence time, the NV center becomes polarized under optical excitation. Once polarized, the quantum state of the NV center spin can be manipulated with external microwave-frequency fields and interrogated remotely with additional green light, since the NV center fluorescence rate depends on the ground state spin projection. Taken together, these properties enable optically detected magnetic resonance (ODMR), in which the NV center's magnetic environment is measured by optically observing its quantum state change in response to applied microwave fields.

FIG. 2 illustrates a schematic diagram of an example of a wide-field diamond magnetic imaging apparatus 200. The magnetic field at the diamond sensor surface 210 is determined by observing fluorescence 220 from a thin surface layer 230 of NV centers 240 excited by excitation light 250, using imaging optics 260 represented by the camera icon. A wide-field imaging modality of NV center magnetic sensing can simultaneously interrogate fields of view larger than 1 mm with sub-micron spatial resolution. In this modality, NV center fluorescence 220 is collected simultaneously from the entire field of view. From NV center fluorescence images obtained under different conditions of an applied microwave drive field 270 (e.g., varied frequency, direction, polarization, or amplitude) over the same field of view, the magnetic field at each pixel can be determined. Additional details of the operation of the wide-field diamond magnetic imaging apparatus are described in International Patent Application No. PCT/US17/057628 filed on Oct. 20, 2017 and entitled METHODS AND APPARATUS FOR MAGNETIC PARTICLE ANALYSIS USING WIDE-FIELD DIAMOND MAGNETIC IMAGING, published on Apr. 26, 2018 as WO 2018/075913 A1, which is incorporated by reference herein.

Because there is no need to scan a fine probe over the field of view, high-resolution images of irregularly-shaped or liquid samples can be obtained rapidly. The imaging technology is compatible with a wide range of environmental conditions, including ambient temperature and pressure, which enables application to temperature- or chemically-sensitive magnetic samples. Wide field diamond magnetic imaging systems are now in regular research use for biological and geophysical magnetic studies. See Barry, J. F., Turner, M. J., Schloss, J. M., Glenn, D. R., Song, Y., Lukin, M. D., Park, H., and Walsworth, R. L., Optical magnetic detection of single-neuron action potentials using quantum defects in diamond, *PNAS* 113, 14133-14138 (2016); Le Sage, D., Arai, K., Glenn, D. R., DeVience, S. J., Pham, L. M., Rahn-Lee, L., Lukin, M. D., Yacoby, A., Komeili, A., and Walsworth, R. L., Optical magnetic imaging of living cells, Nature 496, 486-489 (2013); Fu, R. R., Weiss, B. P., Lima, E. A., Kehayias, P., Araujo, J. F. D. F., Glenn, D. R., Gelb, J., Einsle, J. F., Bauer, A. M., Harrison, R. J., Ali, G. A. H., and Walsworth, R. L., Evaluating the paleomagnetic potential of single zircon crystals using the Bishop Tuff, *Earth Planet. Sci. Lett.* 458, 1-13 (2017); Fu, R. R., Weiss, B. P., Lima, E. A., Harrison, R. J., Bai, X.-N., Desch, S. J., Ebel, D. S., Suavet, C., Wang, H., Glenn, D., Le Sage, D., Kasama, T., Walsworth, R. L., and Kuan, A. T., Solar nebula magnetic fields recorded in the Semarkona meteorite, *Science* (80-). 346, 1089-1092 (2014); Rahn-Lee, L., Byrne, M. E., Zhang, M., Le Sage, D., Glenn, D. R., Milbourne, T., Walsworth, R. L Vali, H., and Komeili, A. A., Genetic Strategy for Probing the Functional Diversity of Magnetosome Formation, *PLoS Genet.* 11, (2015); and Glenn, D. R., Lee, K., Park, H., Weissleder, R., Yacoby, A., Lukin, M. D., Lee, H., Walsworth, R. L., and Connolly, C. B., Single-cell magnetic imaging using a quantum diamond microscope. *Nat. Methods* 12, 736-738 (2015), which are incorporated by reference herein.

Depositing samples directly onto a sensor surface, although potentially yielding good measurement sensitivity and spatial resolution, has a number of disadvantages, such as the potential for contamination between samples, and the time needed to deliver samples to the sensor and to clean the sensor surface after the measurement. Therefore, there is a need for an improved sample cartridge for measuring sample properties in close proximity to a sensing surface that reduces or eliminates the disadvantages described above.

BRIEF SUMMARY

Various embodiments disclosed herein relate to methods and apparatus using a thin membrane as a sample transfer membrane to support a sample for a measurement by a sensor, wherein the membrane is displaced to be in close contact with the sensor. In accordance with one or more embodiments, a cartridge cassette for use with a sensor in performing an assay includes a membrane frame carrier having two or more openings, and a membrane frame structure secured to one side of the membrane frame carrier, the membrane frame structure including two or more openings, each at least partly coincident with a different opening in the membrane frame carrier. The cartridge cassette further includes two or more flexible membranes, each covering and sealing a different one of the two or more openings in the membrane frame structure to define two or more sample wells, each flexible membrane having a sample side supporting a sample and an opposite sensor side, each flexible membrane configured and arranged to be displaceable away from the membrane frame such that the sample is moved to a position closer to a sensor surface of the sensor under a differential pressure between the sample side and the sensor side of the flexible membrane. In some embodiments, the sensor surface can be a nitrogen-vacancy (NV) diamond sensor surface. In certain embodiments, each flexible membrane can be functionalized on the sample side to interact with a sample. In some embodiments, each flexible membrane can be one of a silicon nitride flexible membrane, a crystalline silicon flexible membrane, a silicon dioxide flexible membrane, an amorphous carbon flexible membrane, a graphene flexible membrane, a boron nitride flexible membrane, a metal flexible membrane, or a polymer flexible membrane. In certain embodiments, each flexible membrane can be a silicon nitride flexible membrane having a thickness in a range of between 30 nm and 500 nm, such as 200 nm. In some embodiments, each flexible membrane is displaceable to a distance at a center of the flexible membrane up to 100 µm, such as up to 50 µm, away from the membrane frame structure. In certain embodiments, the pressure on the sensor side of each flexible membrane can be below atmospheric pressure, and the differential pressure can be in a range of between 0.1 kPa and 100 kPa, such as between 0.1 kPa and 50 kPa, or between 1 kPa and 10 kPa. In some embodiments, the cartridge cassette can further include a sample cartridge cap configured and arranged to overlay the membrane frame structure, the sample cartridge cap including a window over at least a portion of each flexible membrane. In some of these embodiments, the sample cartridge cap can further include a plurality of windows over a plurality of flexible membranes. In certain embodiments, the sample cartridge cap can further include a gas inlet for pressurizing the sample side of the flexible membrane to a differential pressure in a range of between 0.1 kPa and 1000 kPa, such as between 100 kPa and 1000 kPa. In some embodiments, each flexible membrane can be configured and arranged to be displaceable away from the membrane frame structure to contact the sensor surface under the differential pressure between the sample side and sensor side of the flexible membrane. In certain embodiments, each flexible membrane can be sized to be displaceable away from the membrane frame structure to contact the sensor surface under the differential pressure between the sample side and the sensor side of the flexible membrane. In some embodiments, the two or more flexible membranes can include 96 flexible membranes. In certain embodiments, the membrane frame carrier can be made of alumina having a thickness in a range of between 0.25 mm and 5 mm, such as 1 mm. In some embodiments, the cartridge cassette can further include a detachable pipette guide configured and arranged to overlay the membrane frame carrier, the pipette guide including a shelf configured to engage a ridge on a sample loading pipette. In certain embodiments, each membrane frame structure can further include a membrane support mesh on each flexible membrane on the sample side of the flexible membrane.

In accordance with one or more embodiments, a sensor system includes a sensor having a sensor surface, a sample cartridge including one or more flexible membranes and a membrane frame, the membrane frame including one or more openings covered by the one or more flexible membranes defining one or more wells for holding one or more samples, the flexible membrane having a sample side supporting the sample and an opposite sensor side, the sample cartridge being removably insertable in the sensor system such that the sensor side of the flexible membrane is positioned above and faces the sensor surface, a displacement mechanism that can be actuated to displace the flexible membrane toward the sensor surface such that the sample is moved to a position closer to the sensor surface, and an optical imaging system that detects light emitted from the sensor. In certain embodiments, the displacement mechanism can be configured and arranged to create a differential pressure between the sample side and the sensor side of the membrane frame, and the flexible membrane can be configured and arranged to be displaceable away from the membrane frame to contact the sensor surface. In some embodiments, the flexible membrane can be sized to be displaceable away from the membrane frame to contact the sensor surface under the differential pressure between the sample side and the sensor side of the flexible membrane. In certain embodiments, the sensor surface can be a nitrogen-vacancy (NV) diamond sensor surface, and the optical imaging system images fluorescence emitted from the NV diamond sensor surface. In some embodiments, the flexible membrane can be functionalized on the sample side to interact with a sample. In certain embodiments, the flexible membrane can be one of a silicon nitride flexible membrane, a crystalline silicon flexible membrane, a silicon dioxide flexible membrane, an amorphous carbon flexible membrane, a graphene flexible membrane, a boron nitride flexible membrane, a metal flexible membrane, or a polymer flexible membrane. In some embodiments, the flexible membrane can be a silicon nitride flexible membrane having a thickness in a range of between 30 nm and 500 nm, such as 200 nm. In certain embodiments, the flexible membrane can be displaceable to a distance at a center of the flexible membrane up to 100 μm, such as up to 50 μm, away from the membrane frame. In some embodiments, the sample cartridge can further include a sample cartridge cap configured and arranged to overlay the membrane frame, the sample cartridge cap including a window over at least a portion of the flexible membrane. In certain embodiments, the sample cartridge cap can include a plurality of windows over a corresponding plurality of flexible membranes. In some embodiments, the sample cartridge cap can further include a gas inlet for pressurizing the sample side of the flexible membrane. In these embodiments, the differential pressure can be in a range of between 0.1 kPa and 1000 kPa, such as in a range of between 100 kPa and 1000 kPa. In certain embodiments, the sample cartridge can further include a membrane frame carrier secured to the membrane frame. In some of these embodiments, the membrane frame carrier can be secured to a plurality of membranes, such as 96 membranes. In certain embodiments, the membrane frame carrier can be made of alumina having a thickness in a range of between 0.25 mm and 5 mm, such as 1 mm. In some embodiments, the optical imaging system can further include a flexible bladder around an optical element of the optical imaging system and a gas inlet for pressurizing the sample side of the flexible membrane, the flexible bladder configured and arranged to removably engage and form a seal with the membrane frame carrier. In these embodiments, the differential pressure can be in a range of between 0.1 kPa and 1000 kPa, such as between 100 kPa and 1000 kPa. In certain embodiments, the sample cartridge can further include a membrane support mesh over the flexible membrane on the sample side of the flexible membrane.

In accordance with one or more embodiments, a method of performing an assay includes depositing a sample into a sample well of a sample cartridge, the sample well defined by a flexible membrane and a membrane frame having an opening sealed by the flexible membrane, the flexible membrane having a sample side supporting the sample and an opposite sensor side, positioning the sample cartridge over a sensor surface such that the sensor side of the flexible membrane faces the sensor surface, displacing the flexible membrane toward the sensor surface such that the sample is moved to a position closer to the sensor surface, and imaging fluorescence emitted from the sensor with an optical imaging system when the sample is in the position closer to the sensor surface. In some embodiments, the method can further include functionalizing the sample side of the flexible membrane to interact with the sample. In certain embodiments, displacing the flexible membrane can include displacing the flexible membrane to a distance at a center of the flexible membrane up to 100 μm, such as up to 50 μm. In some embodiments, displacing the flexible membrane can include displacing the flexible membrane to contact the sensor surface. In certain embodiments, displacing the flexible membrane includes establishing a differential pressure between the sample side and the sensor side of the flexible membrane. In some embodiments, establishing the differential pressure can include evacuating the sensor side of the flexible membrane. In certain embodiments, the differential pressure can be in a range of between 0.1 kPa and 100 kPa, such as between 0.1 kPa and 50 kPa, or between 1 kPa and 10 kPa. In some of these embodiments, evacuating the sensor side of the flexible membrane can include engaging the membrane frame with a gasket to form a seal around a perimeter of the membrane frame. In certain embodiments, establishing the differential pressure can include pressurizing the sample side of the flexible membrane. In some embodiments, the differential pressure can be in a range of between 0.1 kPa and 1000 kPa, such as between 100 kPa and 1000 kPa. In some of these embodiments, pressurizing the sample side of the flexible membrane can include removably positioning a sample cartridge cap over the membrane frame to form a seal with the membrane frame, the sample cartridge cap including a window over at least a portion of the flexible membrane. In certain other embodiments, pressurizing the sample side of the flexible membrane can include removably engaging a flexible bladder with the sample cartridge to form a seal with the sample cartridge, the flexible bladder being disposed around an optical element of the optical imaging system.

Supporting samples on a flexible membrane that can rapidly interface with the sensor and be rapidly removed from the sensor surface prevents sensor contamination and contamination between samples, because only the membrane, and not the sample, comes into contact with the sensor. In addition, multiple individual samples can be deposited at the same time on individual, separate membranes, and then measured in rapid sequence without the need for cleaning the sensor between sample measurements.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIGS. 6A-6F illustrate a schematic sequence of pneumatic actuation by evacuation of the sensor side of the flexible membrane for a single sample well in accordance with one or more embodiments.

FIG. 9A is a simplified cross-section view illustrating use with a sensor apparatus of a multi-well sample cartridge including separate enclosed regions in accordance with one or more embodiments. FIG. 9B shows top views illustrating example layouts of various multi-well membrane arrays shown in FIG. 9A.

FIGS. 10A-10F illustrate a schematic sequence of pneumatic actuation by pressurization of the sample side of the flexible membrane for a single sample well in accordance with one or more embodiments.

FIG. 12C is another simplified cross-section view of a portion of the cartridge cassette shown in FIG. 12A. FIG. 12D is a simplified perspective view illustrating use with a sensor apparatus of the cartridge cassette shown in FIG. 12A in accordance with one or more embodiments. FIG. 12E is a simplified cross-section view illustrating use with a sensor apparatus of a cartridge cassette including a sample cartridge cap in accordance with one or more embodiments.

FIGS. 16A-16C show graphs of membrane deflection (μm) as a function of differential pressure (kPa), using Equation 1.

FIGS. 17A-17C illustrate a schematic sequence of using a sample cartridge with a protective cover in accordance with one or more embodiments.

FIGS. 24a-24e show portions of magnetic images obtained with wide-field diamond magnetic imaging, showing dipole signals from magnetic particles magnetized horizontally in accordance with one or more embodiments. FIG. 24f is a graph of the distance from fit to dipole model as a function of the distance from bead center to diamond.

DETAILED DESCRIPTION

Various embodiments disclosed herein relate to methods and apparatus using a thin membrane as a sample transfer membrane to support a sample for a measurement by a sensor, wherein the membrane is displaced to be in close contact with the sensor.

Embodiments disclosed herein include those that use pneumatic actuation of the membrane using differential pressure, where pneumatic actuation may refer to operation under pressure of any process gas or liquid, including hydraulic actuation. Embodiments may also include mechanical actuation, in which the membrane or its supporting membrane frame is displaced relative to the sensor to establish close contact, and electrostatic actuation, in which the membrane is displaced by electrostatic forces.

Depositing samples directly onto a sensor surface may yield good measurement sensitivity and spatial resolution, but there are drawbacks, as well. Two significant drawbacks are the potential for contamination between samples and the time needed to deliver samples to the sensor and to clean the sensor surface after the measurement. Samples that comprise liquid suspensions or dry particle powders present a particular challenge of potential contamination and time required for sample preparation and sensor cleaning. High-throughput measurements of many samples can be bottle-necked by the time required to transfer between samples, which can exceed the measurement time.

These drawbacks are addressed by supporting samples on a thin membrane that can rapidly interface with the sensor and be rapidly removed from it. Sensor contamination and contamination between samples is prevented because only the membrane, and not the sample, comes in contact with the sensor. In addition, multiple individual samples may be deposited at the same time on individual, separate membranes and then measured in rapid sequence without the need for cleaning the sensor between sample measurements.

Figure 1:
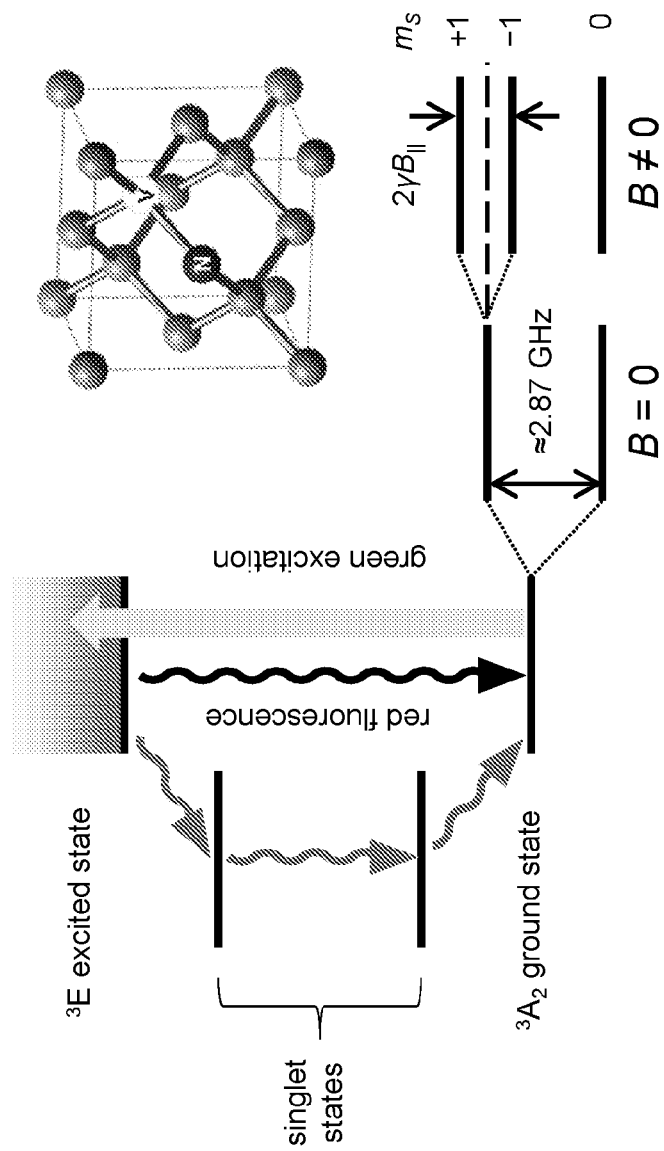
FIG. 1A shows an example of an NV center energy level diagram.
FIG. 1B shows an example of an NV center atomic structure.
Figure 2:
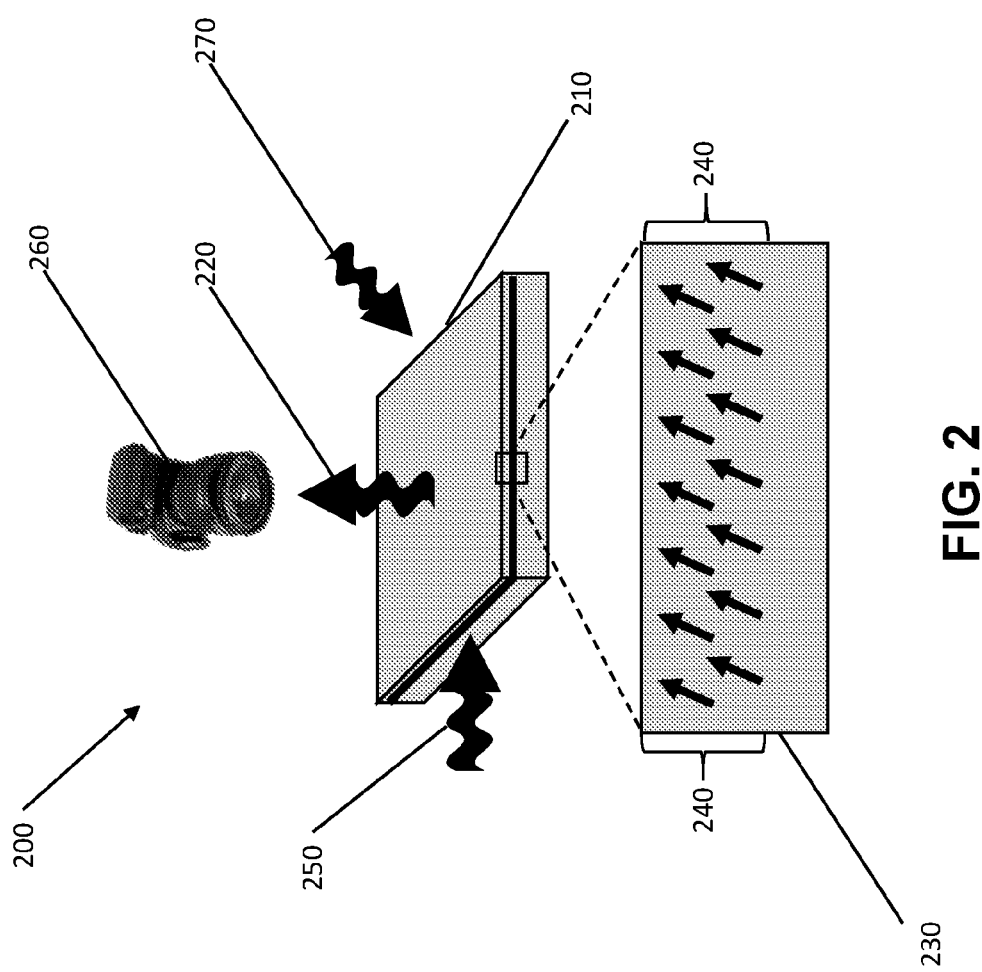
FIG. 2 is a schematic diagram showing an example of a wide-field NV diamond magnetic imaging apparatus.
Figure 3B:
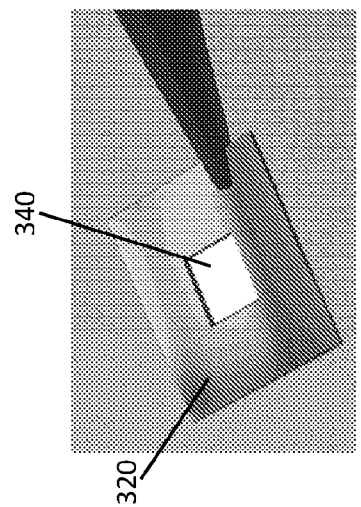
FIG. 3B is a photograph of a 2 mm×2 mm silicon nitride flexible membrane of 1 μm thickness in a silicon membrane frame in accordance with one or more embodiments
Figure 3A:
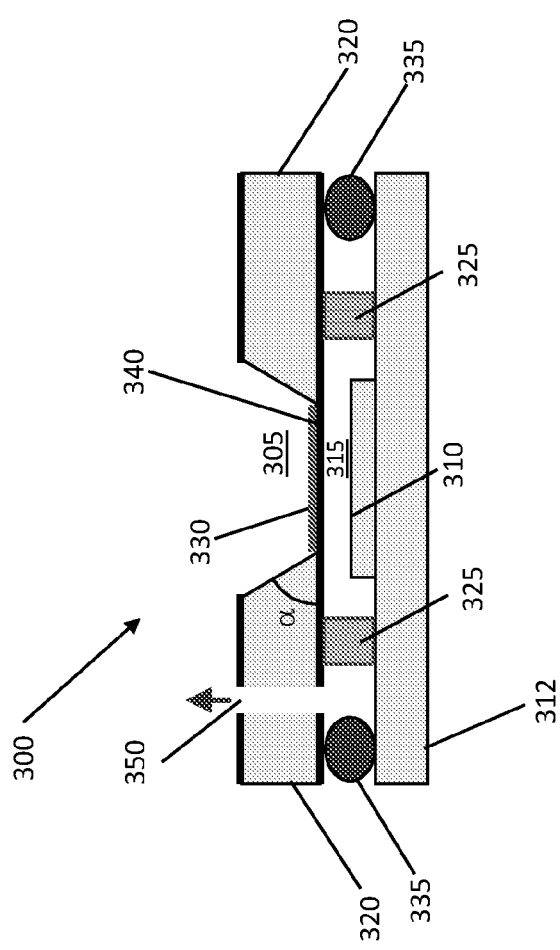
FIG. 3A is a simplified cross-section view illustrating use with a sensor apparatus of a single-well sample cartridge in accordance with one or more embodiments.
Figure 4A:
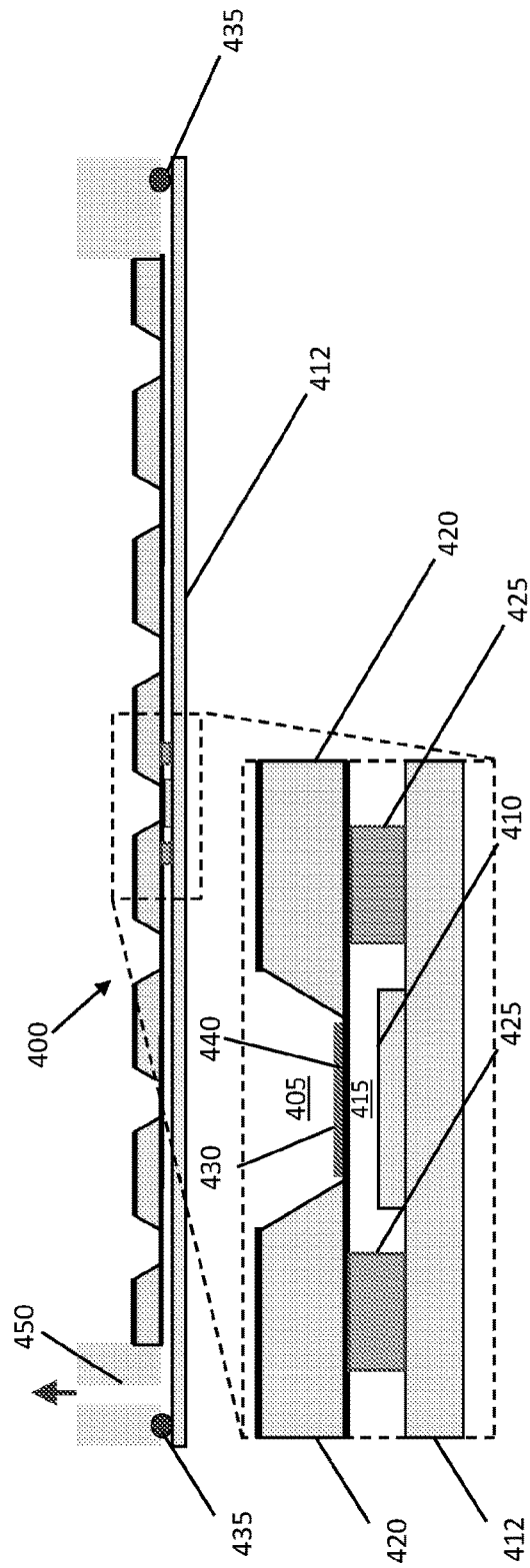
FIG. 4A is a simplified cross-section view illustrating use with a sensor apparatus of a multi-well sample cartridge including a pump line at a periphery of the sample cartridge in accordance with one or more embodiments.
Figure 4B:
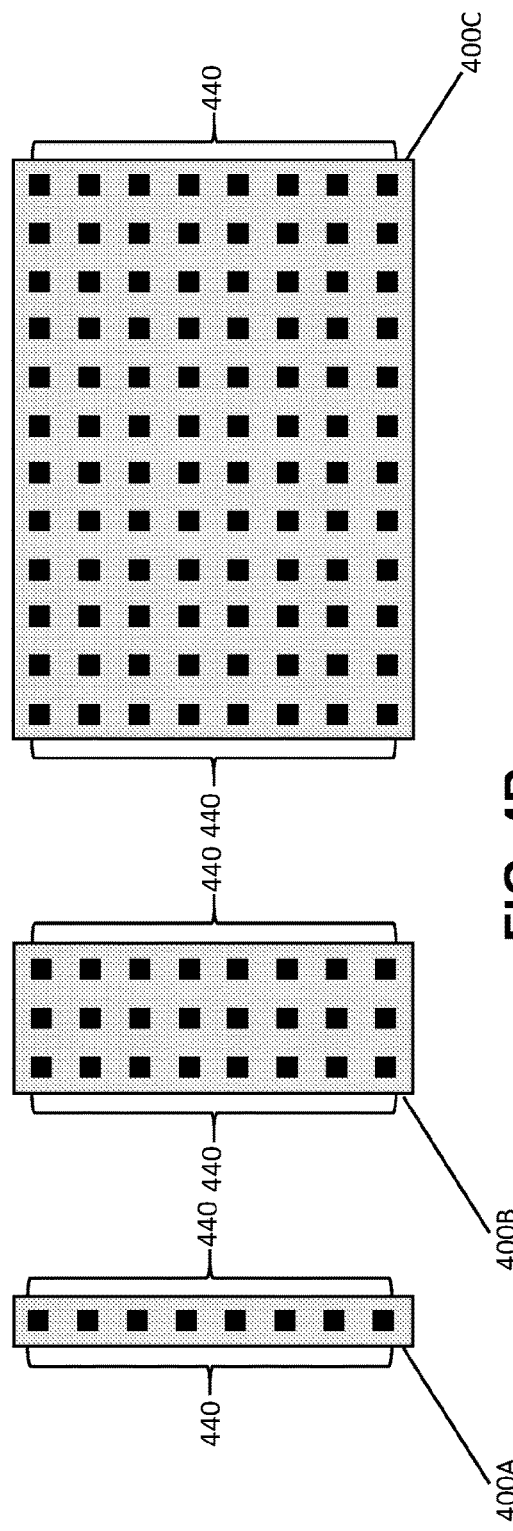
FIG. 4B shows top views illustrating example layouts of various multi-well membrane arrays shown in FIG. 4A.

FIG. 3A is a cross-section view illustrating a sample cartridge 300 over a sensor surface 310 in accordance with one or more embodiments. The sample cartridge 300 comprises a membrane frame or membrane frame structure 320, which, together with a flexible membrane 340, defines a well 330 for holding a sample. FIG. 3A shows a single well in a cartridge 300; FIGS. 4A and 4B illustrate a multi-well sample cartridge 400, described further below.

Turning back to FIG. 3A, each sample cartridge 300 includes the suspended flexible membrane 340, on which a sample is placed in a sample well 330 defined in a membrane frame 320. The flexible membrane 340 has a sample side 305 and an opposite sensor side 315. As shown in FIG. 3A, and in all other embodiments unless otherwise indicated, the flexible membrane 340 is deposited on the membrane frame 320 such that the sensor side 315 of the flexible membrane 340 is positioned above and faces a sensor surface 310, the flexible membrane 340 covering the membrane frame 320 and sealing the sample side 305 from the sensor side 315. The sensor surface 310, which can be a wide-field nitrogen-vacancy (NV) diamond magnetic imaging sensor or other sensor surface, includes one or more sensors 310 positioned on a sensor substrate 312. Spacers 325 are provided on the sensor substrate 312 alongside the sensor surface 310, to position the membrane frame 320 and to keep the flexible membrane 340 and the membrane frame 320 from coming in contact with the sensor surface 310 before pneumatic actuation. The sensor surface 310 can be recessed below the level of the spacers 325, as shown in FIG. 3A, or level with the spacers 325, or protruding above the spacers 325 to a height that does not cause rupture of the flexible membrane 340.

As also shown in FIG. 3A, a gasket 335 on the sensor substrate 312 seals the sensor substrate 312 around the perimeter of the membrane frame 320. The sample cartridge 300 includes a port for a pump line 350. When suction is applied by the pump line 350 evacuating the sensor side 315 of the flexible membrane 340, a differential pressure between the sample side 305 and the sensor side 315 is formed across the flexible membrane 340 to displace it to a position closer to the sensor surface 310, as described further below. This pneumatic actuation minimizes the standoff distance between the sensor surface 310 and sample 330 over the entire imaging field of view. This actuation method also enables the flexible membrane 340 to conform to the sensor surface 310 and accommodates any imperfect positioning of the flexible membrane 340 and the membrane frame 320 over the sensor surface 310.

FIG. 4A is a cross-section view illustrating a multi-well sample cartridge 400 positioned over a sensor surface 410 in accordance to one or more embodiments. The sample cartridge 400 comprises a membrane frame or membrane frame structure 420 defining a well 430 for holding a sample. Each sample well 430 includes a suspended flexible membrane 440, on which the sample is placed in a sample well 430 defined in the membrane frame 420. The flexible membrane 440 has a sample side 405 and an opposite sensor side 415. The sensor surface 410, which can be a wide-field NV diamond magnetic imaging sensor or other sensor surface, includes one or more sensors 410 positioned on a sensor substrate 412. Spacers 425 are provided on the sensor substrate 412 alongside the sensor surface 410, to position the membrane frame 420 and to keep the flexible membrane 440 and the membrane frame 420 from coming in contact with the sensor surface 410 before pneumatic actuation. The sensor surface 410 can be recessed below the level of the spacers 425, as shown in FIG. 4A, or level with the spacers 425, or protruding above the spacers 425 to a height that does not cause rupture of the flexible membrane 440.

As also shown in FIG. 4A, a gasket 435 on the sensor substrate 412 seals the sensor substrate 412 around the periphery of the sample cartridge 400. The sample cartridge 400 includes a port for a pump line 450. When suction is applied by the pump line 450 evacuating the sensor side 415 of the flexible membrane 440, a differential pressure between the sample side 405 and the sensor side 415 is formed across the flexible membrane 440 to displace it to a position closer to the sensor surface 410. This pneumatic actuation minimizes the standoff distance between the sensor surface 410 and sample 430 over the entire imaging field of view. This actuation method also enables the flexible membrane 440 to conform to the sensor surface 410 and accommodates any imperfect positioning of the flexible membrane 440 and the membrane frame 420 over the sensor surface 410. FIG. 4B illustrates a plan view of sample cartridges 400A, 400B, and 400C including 8, 24, and 96 flexible membranes 440, respectively.

Figure 5A:
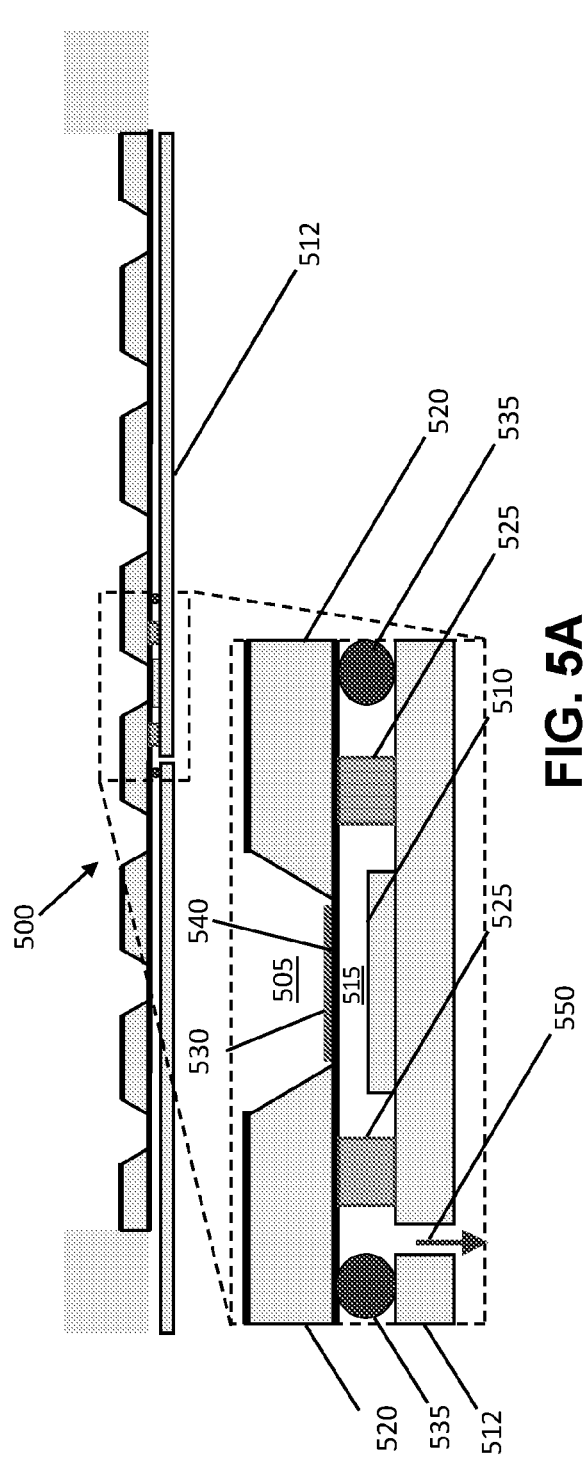
FIG. 5A is a simplified cross-section view illustrating use with a sensor apparatus of a multi-well sample cartridge including a pump line incorporated into the sensor substrate in accordance with one or more embodiments.
Figure 5B:
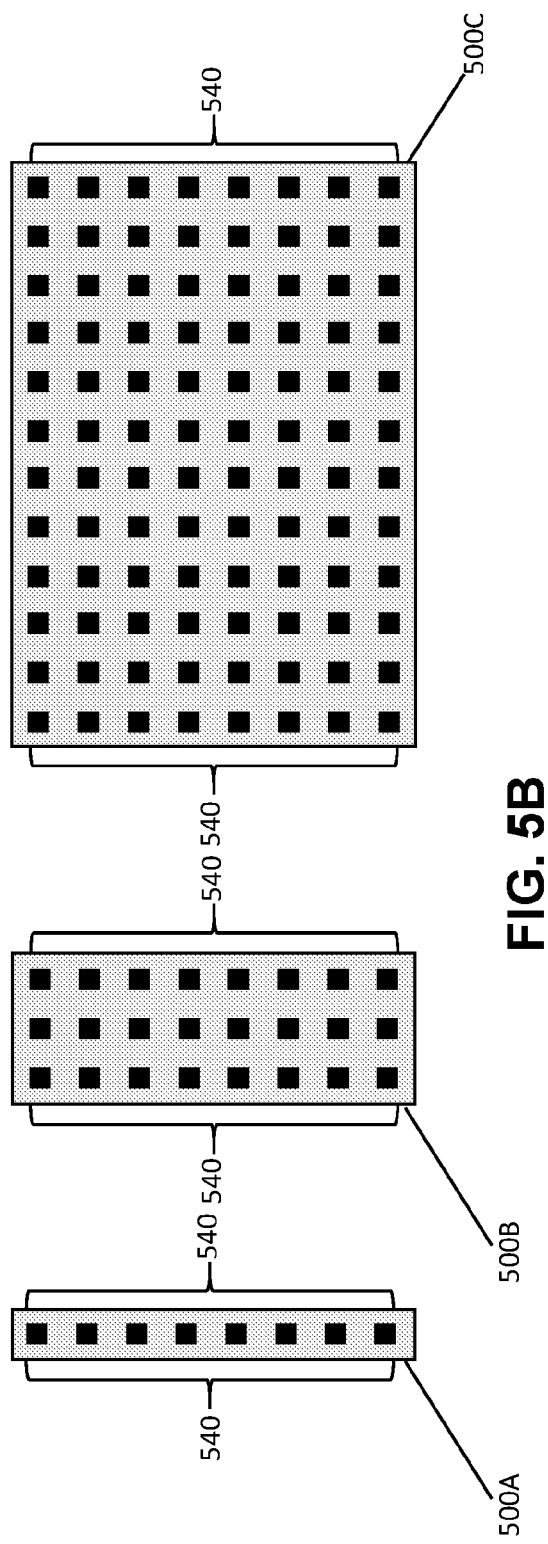
FIG. 5B shows top views illustrating example layouts of various multi-well membrane arrays shown in FIG. 5A.

In the embodiment shown in FIGS. 4A and 4B, the pump line 450 and the gasket 435 are located at the periphery of the sample cartridge 400. In another embodiment, shown in FIG. 5A, the pump line 550 is incorporated into the sensor substrate 512, and the gasket 535 seals the sensor substrate 512 around the perimeter of the membrane frame or membrane frame structure 520, alongside the spacers 525. This embodiment enables actuation of as few as one flexible membrane 540 of a sample cartridge 500 that might have 8, 24, or 96 flexible membranes 540 as illustrated in the plan view shown in FIG. 5B of sample cartridges 500A, 500B, and 500C, respectively, leaving the other membranes 540 unaffected by actuation until they are measured. This approach may also minimize the vacuum chamber volume, gas flow, and contact surface necessary for the vacuum seal. FIG. 5A also shows the sensor surface 510, sample 530, sample side 505 and sensor side 515 of the flexible membrane 540.

FIGS. 6A-6F illustrate an example of a schematic sequence of pneumatic actuation for the single sample well shown in FIG. 3A in accordance with one or more embodiments. Only the first introduced or modified elements of FIG. 3A are indicated in FIGS. 6A-6F for clarity. The steps are as follows: (1) The sample 330 is loaded onto the flexible membrane surface 340 (as shown in FIG. 6A). (2) The membrane frame 320 is brought into contact with the vacuum chamber gasket 335 to form a seal with the sensor substrate 312 (as shown in FIG. 6B). The flexible membrane 340 covers and seals the sample side 305 from the sensor side 315 of the flexible membrane 340. Spacers 325 are provided on the sensor substrate 312 alongside the sensor surface 310, to keep the flexible membrane 340 and the membrane frame 320 from coming in contact with the sensor surface 310 before pneumatic actuation. (3) The vacuum chamber is evacuated by pumping on the pump line 350, and the resulting differential pressure across the flexible membrane 340 displaces it to a position closer to the sensor surface 310 (as shown in FIG. 6C). This displacement can be to a distance at a center of the flexible membrane 340 of up to 100 µm, such as 50 µm, away from the membrane frame 320. (4) At sufficient differential pressure, the flexible membrane 340 is displaced into contact with the sensor surface 310 over a region that includes the measurement field of view (as shown in FIG. 6D). (5) After measurement by the sensor, the vacuum chamber is vented to relieve the differential pressure, causing the flexible membrane 340 to relax back to a state of low displacement (as shown in FIG. 6E). (6) The membrane frame 320 is lifted away from the sensor to break the seal of the vacuum chamber, allowing for a new sample well to interface with the sensor (as shown in FIG. 6F).

Figure 7:
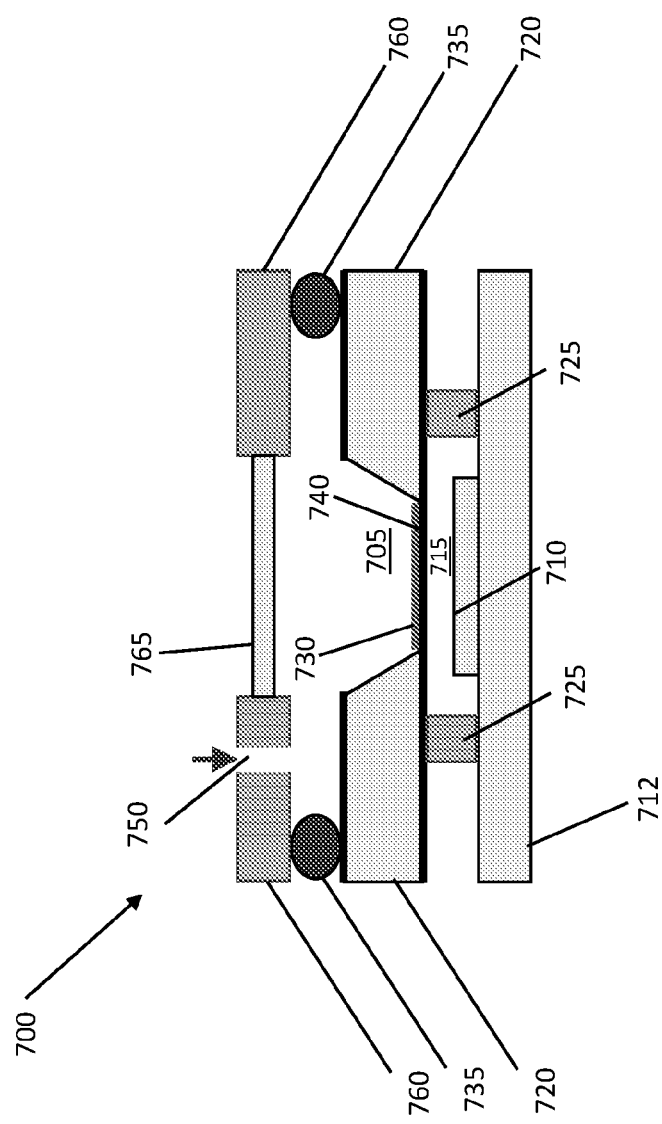
FIG. 7 is a simplified cross-section view illustrating use with a sensor apparatus of a single-well sample cartridge including a sample cartridge cap in accordance with one or more embodiments.
Figure 8A:
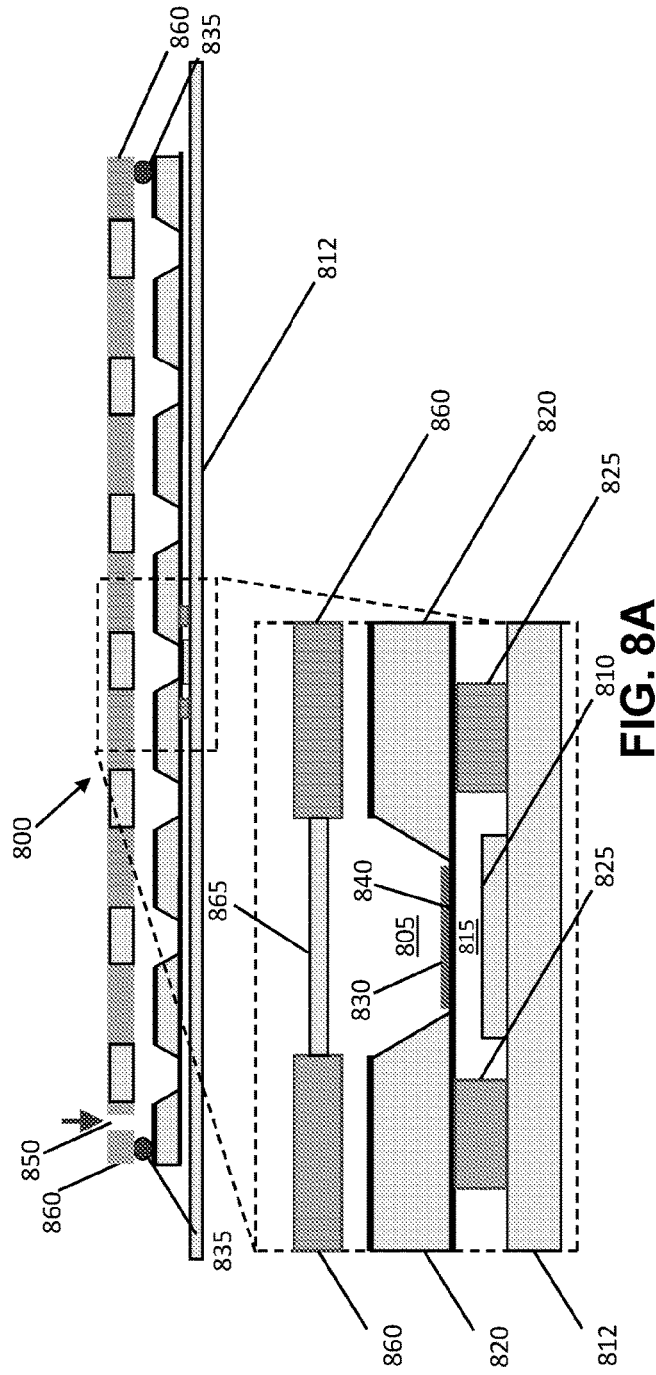
FIG. 8A is a simplified cross-section view illustrating use with a sensor apparatus of a multi-well sample cartridge including a gasket at a periphery of the sample cartridge cap in accordance with one or more embodiments.

FIG. 7 is a cross-section view illustrating a sample cartridge 700 including a sample cartridge cap 760 over a sensor surface 710 in accordance with one or more embodiments. The sample cartridge cap 760 includes a window 765 that is transparent to light emitted from the sensor 710. A membrane frame or membrane frame structure 720 defines, together with a flexible membrane 740, a well 730 for holding a sample. FIG. 7 shows a single well in a cartridge 700; FIGS. 8A, and 9A illustrate multi-well sample cartridges 800 and 900, respectively, described further below.

Turning back to FIG. 7, the flexible membrane 740 can be displaced by a differential pressure between the sample side 705 and the sensor side 715 of the flexible membrane 740 formed by pressurizing the sample side 705 through the pump line 750. Applying positive pressure to the sample side 705 of the flexible membrane 740 enables differential pressures several times atmospheric pressure, to produce up to maximum membrane displacement. After loading the sample well 730 with a sample, a sample cartridge cap 760 is applied to a gasket 735 around the periphery of the membrane frame 720 to form a seal. The enclosed region containing the sample well 730 is then pressurized to displace the flexible membrane 740 to a position closer to the sensor surface 710. Spacers 725 are provided on the sensor substrate 712 alongside the sensor surface 710, to position the membrane frame 720 and to keep the flexible membrane 740 and the membrane frame 720 from coming in contact with the sensor surface 710 before pneumatic actuation. The sensor surface 710 can be recessed below the level of the spacers 725, as shown in FIG. 7, or level with the spacers 725, or protruding above the spacers 725 to a height that does not cause rupture of the flexible membrane 740.

FIG. 8A is a cross-section view illustrating a multi-well sample cartridge 800 including a sample cartridge cap 860 over a sensor surface 810 in accordance to one or more embodiments. The sample cartridge cap 860 includes a window 865 that is transparent to light emitted from the sensor 810. A membrane frame or membrane frame structure 820 defines a well 830 for holding a sample. Each sample well 830 includes a suspended flexible membrane 840, on which a sample is placed in the sample well 830 defined in the membrane frame 820. The flexible membrane 840 has a sample side 805 and an opposite sensor side 815. The sensor surface 810, which can be a wide-field NV diamond magnetic imaging sensor or other sensor surface, includes one or more sensors 810 positioned on a sensor substrate 812. Spacers 825 are provided on the sensor substrate 812 alongside the sensor surface 810, to position the membrane frame 820 and to keep the flexible membrane 840 and the membrane frame 820 from coming in contact with the sensor surface 810 before pneumatic actuation. The sensor surface 810 can be recessed below the level of the spacers 825, as shown in FIG. 8A, or level with the spacers 825, or protruding above the spacers 825 to a height that does not cause rupture of the flexible membrane 840.

Figure 8B:
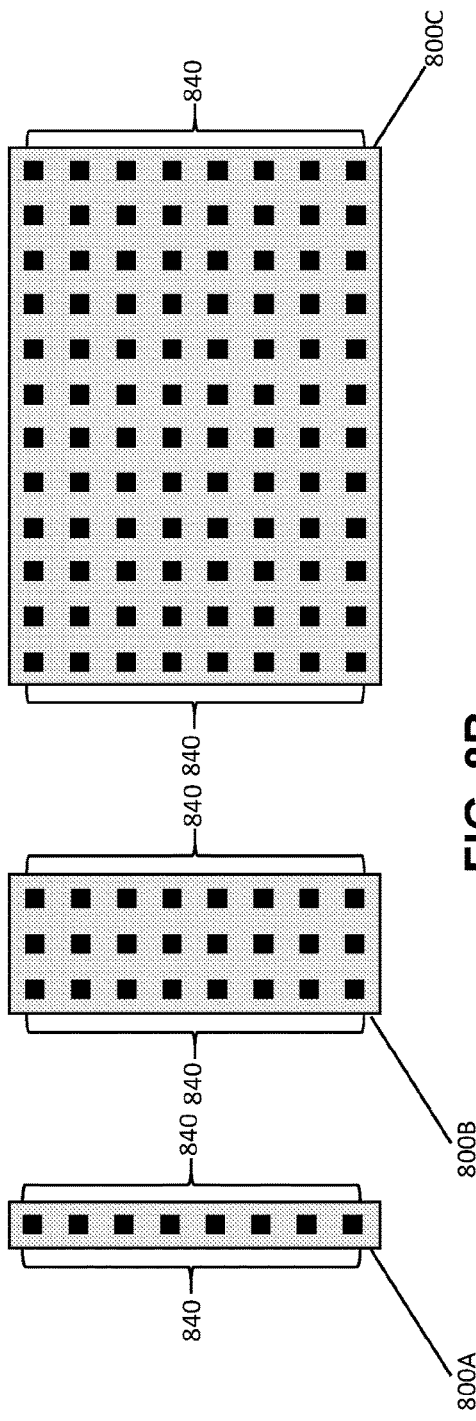
FIG. 8B shows top views illustrating example layouts of various multi-well membrane arrays shown in FIG. 8A.

As also shown in FIG. 8A, a gasket 835 at the periphery of the sample cartridge cap 860 seals the membrane frame 820 around the periphery of the sample cartridge cap 860. The sample cartridge 800 includes a port for a pump line 850. When pressure is applied through the pump line 850 pressurizing the sample side 805 of the flexible membrane 840, a differential pressure between the sample side 805 and the sensor side 815 is formed across the flexible membrane 840 to displace it to a position closer to the sensor surface 810. This pneumatic actuation minimizes the standoff distance between the sensor surface 810 and sample 830 over the entire imaging field of view. This actuation method also enables the flexible membrane 840 to conform to the sensor surface 810 and accommodates any imperfect positioning of the flexible membrane 840 and the membrane frame 820 over the sensor surface 810. FIG. 8B illustrates a plan view of sample cartridges 800A, 800B, and 800C including 8, 24, and 96 flexible membranes 840, respectively. All membranes in a multi-well sample cartridge 800 can be deflected together, although only a subset may be located at one or more sensors. In this case, the other membranes will be displaced without coming into contact with a sensor surface.

In another embodiment, shown in FIG. 9A, more than one sample well 930 of a multi-well cartridge 900 may be sealed with separate gaskets 935 or separate portions of the same gasket 935 to form separate enclosed regions. Each enclosed region may be pressurized independently of the others by separate pump lines 950 through the sample cartridge cap 960, which would minimize the number of displacement cycles for each individual flexible membrane (in comparison with the embodiment shown in FIGS. 8A and 8B). FIG. 9A also shows the sensor surface 910 on the sensor substrate 912, spacers 925, membrane frame or membrane frame structure 920, sample side 905 and sensor side 915 of the flexible membrane 940, and window 965 that is transparent to light emitted from the sensor 910. FIG. 9B illustrates a plan view of sample cartridges 900A, 900B, and 900C including 8, 24, and 96 flexible membranes 940, respectively.

FIGS. 10A-10F illustrate a schematic sequence of pneumatic actuation for the single sample well shown in FIG. 7, in accordance with one or more embodiments. Only the first introduced or modified elements of FIG. 7 are indicated in FIGS. 10A-10F for clarity. The steps are as follows: (1) The sample 730 is loaded onto the flexible membrane surface 740 (as shown in FIG. 10A). (2) The sample cartridge cap 760 is brought into contact with the sample cartridge gasket 735 to form a seal and the sealed sample cartridge 700 is brought into position near the sensor 710 (as shown in FIG. 10B). The flexible membrane 740 covers and seals the sample side 705 from the sensor side 715 of the flexible membrane 740. Spacers 725 are provided on the sensor substrate 712 alongside the sensor surface 710, to keep the flexible membrane 740 and the membrane frame 720 from coming in contact with the sensor surface 710 before pneumatic actuation. (3) The sample cartridge 700 is pressurized by adding gas (such as air or nitrogen) to the gas line 750, and the resulting differential pressure across the flexible membrane 740 displaces it to a position closer to the sensor surface 710 (as shown in FIG. 10C). This displacement can be to a distance at a center of the flexible membrane 740 of up to 100 µm, such as 50 µm, away from the membrane frame 720. (4) At sufficient differential pressure, the flexible membrane 740 is displaced into contact with the sensor surface 710 over a region that includes the measurement field of view (as shown in FIG. 10D). (5) After measurement by the sensor, the sample cartridge 700 is vented to relieve the differential pressure, causing the flexible membrane 740 to relax back to a state of low displacement (as shown in FIG. 10E). (6) The sample cartridge 700 is lifted away from the sensor, allowing for a new sample well to interface with the sensor (as shown in FIG. 10F).

The membrane in accordance with one or more embodiments should be thin, flexible, elastic to allow for sufficient displacement under a reasonable differential pressure, and impermeable to the sample, so that the sample does not seep through the membrane to contact the sensor surface. Use of a thin membrane inhibits significant degradation of sensing performance due to the presence of the membrane, since the distance between the sensor and sample is at least the membrane thickness. Membrane performance is optimized when the membrane is thin compared to the spatial resolution of the sensor, and thin enough to ensure that the signal magnitude of the measurement is only modestly affected. A membrane thickness less than 1 µm can achieve these goals in many cases, such as a thickness in a range of between 30 nm and 500 nm, for example 200 nm.

The membrane in accordance with one or more embodiments should also be robust enough not to rupture during sample loading, during actuation onto the sensor surface, during removal from the sensor surface, or during any other step in the sample transfer and measurement process. To be sufficiently robust, the membrane should not be thinner than is necessary to allow for pneumatic actuation and to ensure good signal strength and spatial resolution for sample measurements.

Many technologies exist for producing freestanding thin membranes of different compositions. Membranes may be deposited on supporting surfaces using processes such as physical vapor deposition, chemical vapor deposition, low-pressure chemical vapor deposition, plasma-enhanced chemical vapor deposition, atomic layer deposition, chemical bath deposition, chemical solution deposition, spin coating, dip coating, evaporation, molecular beam epitaxy, sputtering, plating, or electroplating. In order to produce freestanding membranes, a membrane may first be deposited or formed on a supporting surface, then removed from it, and finally mounted on a frame suitable for mechanical support of the membrane in a region surrounding a freestanding portion of the membrane. The membrane may be bonded to the frame chemically, by application of pressure (pressing), by heating or cooling, or other methods. Alternative methods for producing freestanding membranes include removing only one or more portions of the supporting surface on which the membrane was deposited or formed, leaving the membrane freestanding in one or more regions, with the remaining supporting surface providing the membrane frame. Portions of the supporting surface may be removed using wet etching, plasma etching, reactive ion etching, sputter etching, ion milling, or other processes.

Suitable membrane materials in accordance with one or more embodiments include, but are not limited to, silicon nitride, crystalline silicon, silicon dioxide, amorphous carbon, graphene, metals, including beryllium, polymers, including Formvar, Mylar, polycarbonate, Etnom, Zythene, polypropylene, polyimide (Kapton), Prolene, and Ultrapolyester, composites of multiple materials, such as polymers containing carbon nanotubes or boron nitride nanotubes, or layered composites comprising multiple materials in layers.

The differential pressure P needed to deflect a thin rectangular membrane by a distance d at its center can be described by the following equation, with contributions from internal tensile stress and membrane stress:

$$P = C_1 \frac{\sigma t}{a^2} d + C_2 \frac{E t}{a^4} d^3 \quad (1)$$

where t and a are the membrane thickness and half the membrane width, respectively, $\sigma$ is the internal tensile stress, E is the Young's modulus, and $C_1$ and $C_2$ are constants dependent on membrane geometry and Poisson's ratio, v. See Tabata, O., Kawahata, K., Sugiyama, S., and Igarashi, I., Mechanical property measurements of thin films using load-deflection of composite rectangular membranes, *Sensors and Actuators* 20, 135-141 (1989), which is incorporated by reference herein. For a certain choice of membrane composition, the membrane geometry can be adjusted to ensure an appropriate membrane displacement at a practical differential pressure.

Figure 11B:
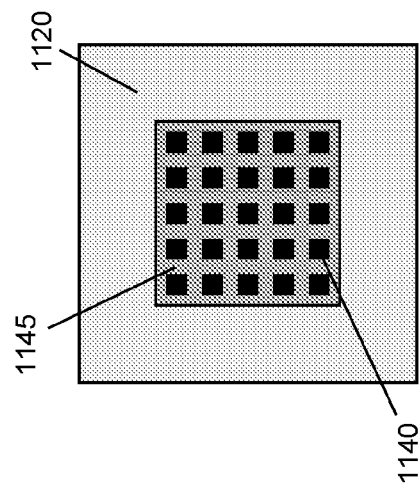
FIGS. 11A and 11B are simplified cross-section and top views, respectively, illustrating a single-well sample transfer flexible membrane including a membrane support mesh in accordance with one or more embodiments.
Figure 11A:
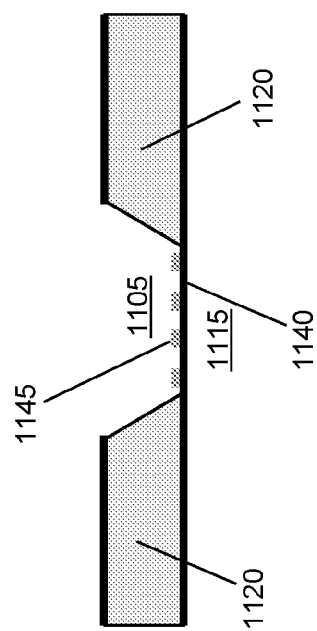

In accordance with one or more embodiments, as shown in FIGS. 11A and 11B, flexible membranes 1140 can be strengthened by adding a membrane support mesh 1145 that is more rigid than the flexible membrane 1140. If the membrane support mesh 1145 is used on the sample side 1105 of the membrane frame or membrane frame structure 1120, then the opposite side (the sensor side 1115) remains smooth for close contact with the sensor (not shown). The membrane support mesh 1145 can interfere with sample measurements such that measurements can only be made in the open areas of the membrane support mesh 1145. In accordance with one or more embodiments, the membrane support mesh 1145 can be comprised of the same material as the membrane frame 1120. The membrane support mesh 1145 can be constructed when the freestanding membrane is fabricated by incompletely removing the supporting surface on which the membrane 1140 was deposited or formed by etching the supporting surface, leaving the membrane support mesh 1145 behind. In another embodiment, the membrane support mesh 1145 can be deposited separately after membrane fabrication and can be comprised of a metal, oxide, semiconductor, or any other amorphous or crystalline material that can be deposited with suitable spatial resolution and thickness. Since the mesh has open regions and can be comprised of a different material, the mesh can be thicker than the membrane and still allow for suitable displacement under differential pressure.

In accordance with one or more embodiments, differential pressures of less than 100 kPa can be applied to the membrane either as pressure to the sample side of the flexible membrane or as vacuum to the sensor side of the flexible membrane. The latter does not require sealing the top of the sample cartridge with a cap, which can interfere with the imaging system optical path, although, as described above, the sample cartridge cap includes a window suitable for imaging the light emitted from the sensor. In accordance with one or more embodiments, a pressure range of 0.1-50 kPa can provide sufficient differential pressure to avoid sensitivity to fluctuations in room pressure and be readily and rapidly produced with a simple and low-cost vacuum pump apparatus. In accordance with one or more embodiments, a pressure range of 1-10 kPa provides a balance of low force on the membrane frame structure (to minimize deflection of the membrane frame, rather than displacement of the membrane) and ease of accurate pressure measurement, for monitoring and control purposes.

In accordance with one or more embodiments, differential pressures greater than 100 kPa can also be applied to the sample side of the membrane. In one or more embodiments, a pressurized chamber can be formed with the sample side of the membrane within the pressurized chamber and the sensor external to the chamber. In this embodiment, the membrane is displaced toward the sensor under differential pressure when the chamber pressure is increased above the ambient pressure outside the chamber. Differential pressures of 100-1,000 kPa can be applied to achieve large membrane displacements, including maximal displacements at the maximum differential pressure that can be applied before membrane failure. In comparison to applying differential pressure with a vacuum chamber on the sensor side of the membrane, applying differential pressure with a pressurized chamber can produce a suitable displacement of even a stiff membrane. Membranes can be stiff due to large thickness, small lateral size, high Young's modulus, high internal tensile stress, use of a membrane support mesh, or other reasons.

Figure 12A:
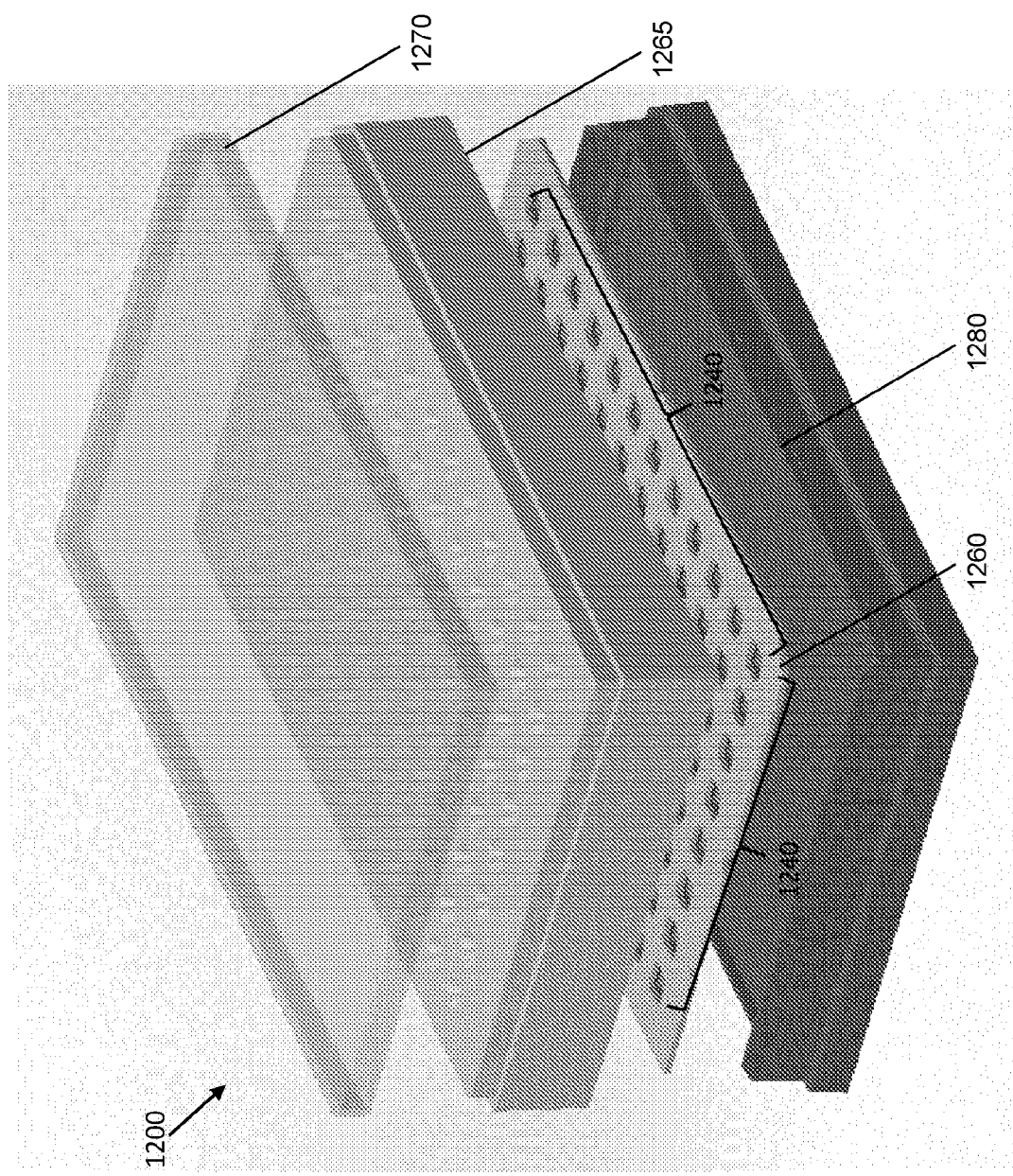
FIG. 12A is a simplified perspective view of a cartridge cassette for use in performing an assay in accordance with one or more embodiments.
Figure 12B:
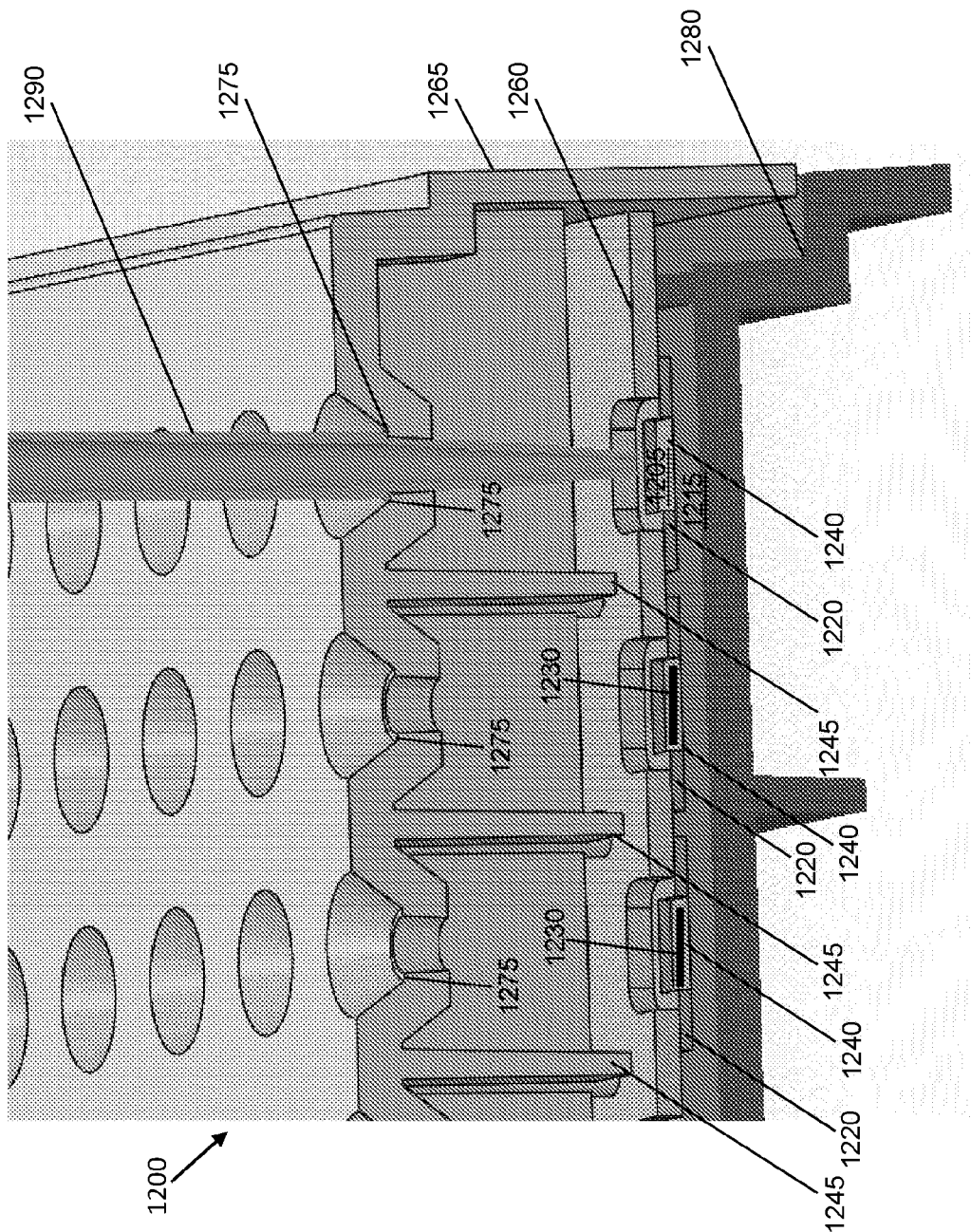
FIG. 12B is a simplified cross-section view of a portion of the cartridge cassette shown in FIG. 12A.

In accordance with one or more embodiments, as shown in FIGS. 12A-12D, a cartridge cassette 1200 for use with a sensor in performing an assay includes a membrane frame carrier 1260 having two or more openings, and a membrane frame structure 1220 (shown in FIGS. 12B and 12C) secured to one side of the membrane frame carrier 1260, the membrane frame structure 1220 including two or more openings, shown in FIGS. 12B and 12C, each at least partly coincident with a different opening in the membrane frame carrier 1260. The cartridge cassette 1200 further includes two or more flexible membranes 1240, each covering and sealing a different one of the two or more openings in the membrane frame structure 1220 to define two or more sample wells 1230, each flexible membrane 1240 having a sample side 1205 supporting a sample and an opposite sensor side 1215, each flexible membrane 1240 configured and arranged to be displaceable away from the membrane frame structure 1220 such that the sample is moved to a position closer to a sensor surface 1210 (shown in FIG. 12D) of the sensor under a differential pressure between the sample side 1205 and the sensor side 1215 of the flexible membrane 1240. FIG. 12A shows an array of 96 membranes 1240 packaged in a cartridge cassette 1200 that interfaces with a sensor, such as an NV diamond sensor, configured to process multiple samples. The cartridge cassette 1200 is designed to ensure sample cleanliness by including the cartridge cassette cover 1270 and the cartridge cassette base 1280, shown in FIG. 12A. The cartridge cassette cover 1270 and the cartridge cassette base 1280 can be made of any material compatible with biological sample processing, such as molded polycarbonate.

The membrane frame carrier 1260 is secured to the membrane frame structure 1220 using any adhesive suitable to bond the two pieces. This bonding layer can be made of two-part epoxy (commercially available from, e.g., MASTERBOND, Henkel, etc.), heat activated adhesive (e.g., Nitto), bonding material such as acrylic layers (e.g., 3M), or polymeric fabrics enhanced or infused with epoxy adhesives (e.g., Henkel, MASTERBOND). In an example of the process, the bonding layer, with a thickness in a range of between 20 µm and 600 µm, can be attached or applied to the membrane frame carrier 1260 first. The bonding layer can be pre-formed or pre-cut to allow for openings in the membrane frame carrier 1260 to align and have access to the cavity above the membrane layer in the membrane frame structure 1220. Using an alignment apparatus or an alignment jig, the membrane frame structure 1220 can be aligned to the sample well (96 well) positions and pressed against the bonding layer already assembled onto the membrane frame carrier 1260. Bonding can then be activated by a combination of heat and pressure to ensure the membrane frame 1220 and the membrane frame carrier 1260 have reasonable contact, acceptable parallelism, and will have a unified bond formed together. The heat applied can be through raising the temperature of the alignment jig holding the membrane frame structure 1220 in place, or by heating all components including the alignment jig, membrane frame structure 1220 and the membrane frame carrier 1260 in a convection heating system such as an oven. The bonding process can typically be completed at a temperature a range of between 35° C. and 180° C.

The membrane frame carrier 1260 can be made of any non-magnetic and impermeable rigid material, such as alumina having a thickness in a range of between 0.25 mm and 5 mm, such as 1 mm. The flexible membrane 1240 can be one of a silicon nitride flexible membrane, a crystalline silicon flexible membrane, a silicon dioxide flexible membrane, an amorphous carbon flexible membrane, a graphene flexible membrane, a boron nitride flexible membrane, a metal flexible membrane, or a polymer flexible membrane. The flexible membrane 1240 can be functionalized on the sample side to interact with a sample. In certain embodiments, the flexible membrane 1240 can be a silicon nitride flexible membrane 1240 having a thickness in a range of between 30 nm and 500 nm, such as 200 nm. The membrane frame structure 1220 can further include a membrane support mesh on the flexible membrane 1240 on the sample side 1205 of the flexible membrane 1240, similar to the membrane support mesh 1145 shown in FIGS. 11A-11B and described above. In some embodiments, the flexible membrane 1240 can be displaceable to a distance at a center of the flexible membrane 1240 up to 100 µm, such as 50 µm, away from the membrane frame structure 1220. In some embodiments, the flexible membrane 1240 can be displaced away from the membrane frame structure 1220 to contact the sensor surface 1210 under the differential pressure between the sample side 1205 and sensor side 1215 of the flexible membrane 1240. In certain embodiments, the pressure on the sensor side of the flexible membrane can be below atmospheric pressure, and the differential pressure can be in a range of between 0.1 kPa and 100 kPa, such as between 0.1 kPa and 50 kPa, or between 1 kPa and 10 kPa. In some embodiments, as shown in FIG. 12E, the cartridge cassette 1200 further includes a sample cartridge cap 1262 configured and arranged to overlay the membrane frame structure 1220 and membrane frame carrier 1260, the sample cartridge cap 1262 including a window 1264 over at least a portion of each flexible membrane 1240. In some of these embodiments, the sample cartridge cap can further include a plurality of windows over a plurality of flexible membranes. In certain embodiments, the sample cartridge cap can further include a gas inlet 1250 for pressurizing the sample side 1205 of the flexible membrane 1240 to a differential pressure in a range of between 0.1 kPa and 1000 kPa, such as between 100 kPa and 1000 kPa. FIG. 12E also shows the gasket 1235, sample well 1230, spacers 1225 around the sensor 1210, and sensor substrate 1212.

Turning back to FIGS. 12A-12C, the cartridge cassette 1200 includes an optional detachable pipette guide 1265 that overlays the membrane frame carrier 1260. The detachable pipette guide 1265 can be made of any material compatible with biological sample processing, such as molded polycarbonate. As shown in FIGS. 12B and 12C, the pipette guide 1265 includes a shelf 1275 configured to engage a ridge 1285 on a sample loading pipette 1290 that delivers a sample, shown in FIG. 12C, into the sample well 1230. Sample loading pipettes with suitable ridges are commercially available. E.g., Axygen Part No. TF-L-R-S 420, (Corning, N.Y.). The shelf 1275 is formed in the pipette guide 1265 in a molding or other process. The detachable pipette guide 1265 ensures repeatable positioning at a consistent distance between the pipette tip 1290 and the flexible membrane 1240. The detachable pipette guide 1265 thereby ensures the integrity of the flexible membrane 1240 and enhances the ease of use of the cartridge cassette 1200 for an operator. As shown in FIG. 12B, the detachable pipette guide 1265 also optionally includes membrane frame carrier holddowns 1245 that secure the membrane frame carrier 1260, membrane frame structures 1220, and flexible membranes 1240 against the cartridge cassette base 1280 during transport, thus improving the integrity of the assembly. The cartridge cassette 1200 is designed to interface with single pipettors, multi-channel pipettors, and standard laboratory automation equipment.

Figure 13A:
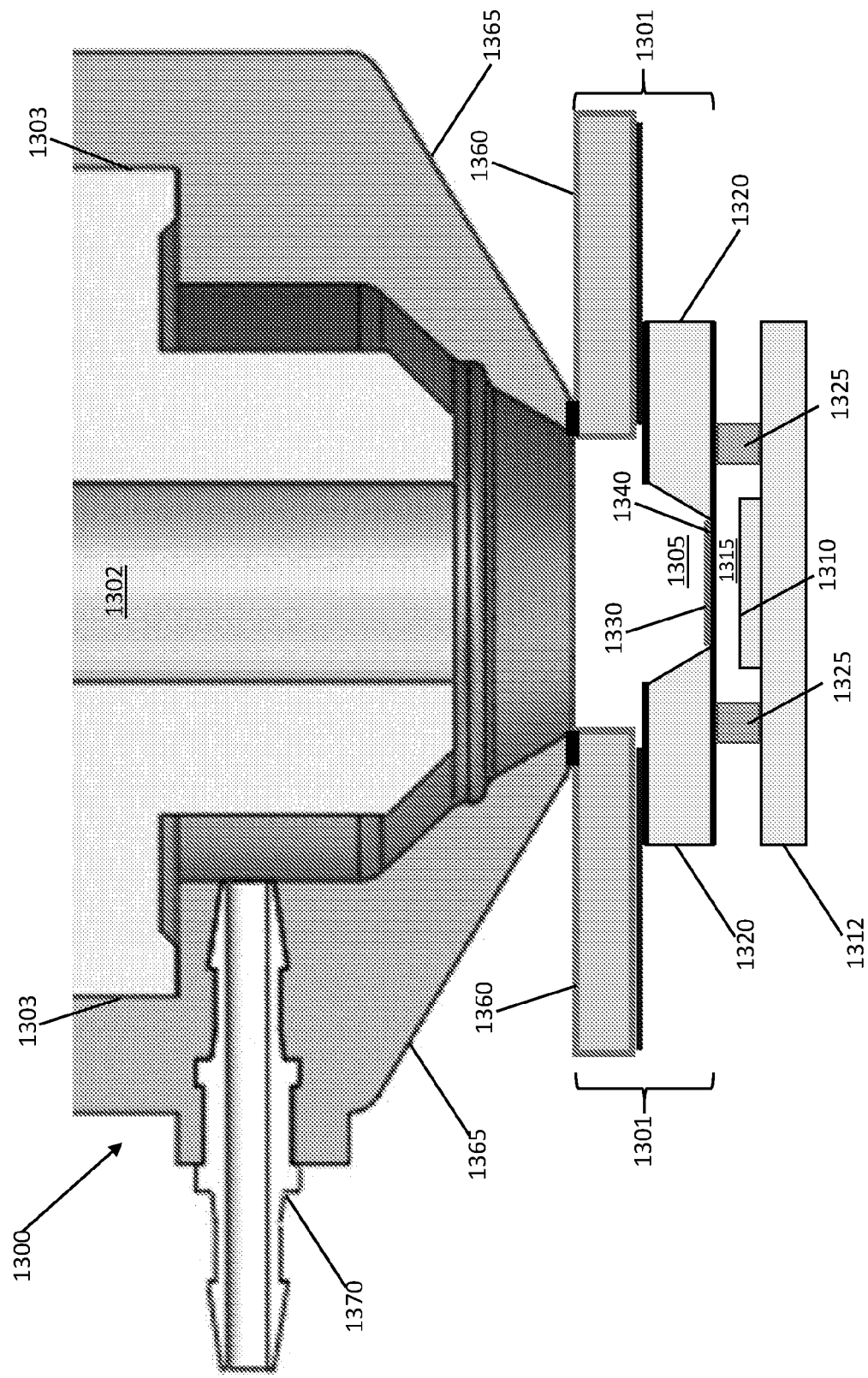
FIG. 13A is a simplified cross-section view illustrating a sensor system including a sample cartridge in accordance with one or more embodiments.
Figure 13B:
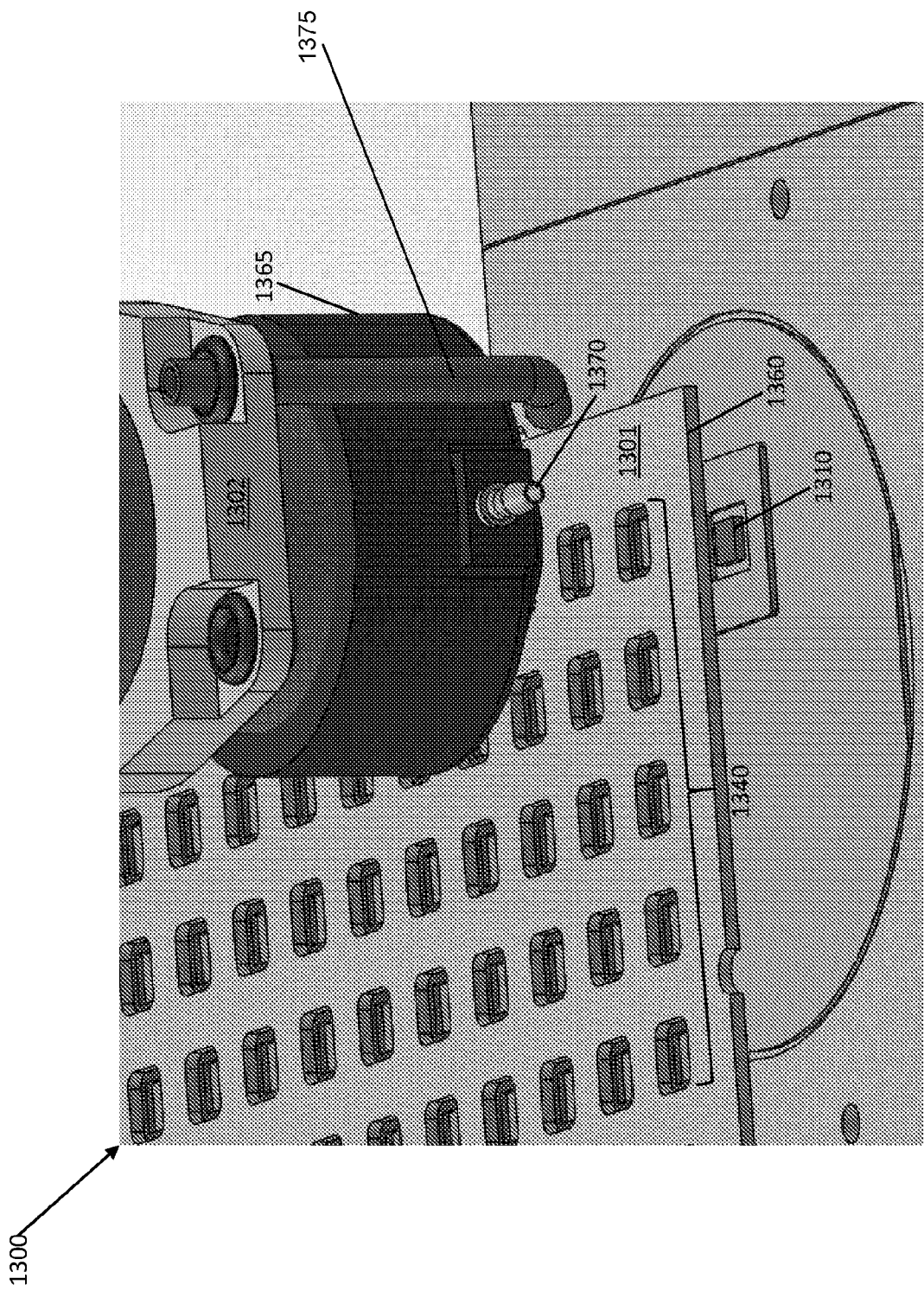
FIG. 13B is a simplified perspective (exploded) view of the sensor system shown in FIG. 13A.

In accordance with one or more embodiments, as shown in FIGS. 13A and 13B, a sensor system 1300 includes a sensor having a sensor surface 1310, a sample cartridge 1301 including one or more flexible membranes 1340 and a membrane frame or membrane frame structure 1320, the membrane frame including one or more openings covered by the one or more flexible membranes 1340 defining one or more wells 1330 for holding one or more samples, the flexible membrane having a sample side 1305 supporting the sample and an opposite sensor side 1315, the sample cartridge 1301 being removably insertable in the sensor system 1300 such that the sensor side 1315 of the flexible membrane 1340 is positioned above and faces the sensor surface 1310, a displacement mechanism (described below) that can be actuated to displace the flexible membrane 1340 toward the sensor surface 1310 such that the sample is moved to a position closer to the sensor surface 1310, and an optical imaging system 1302 that detects light emitted from the sensor 1310. In certain embodiments, the displacement mechanism can be configured and arranged to create a differential pressure between the sample side 1305 and the sensor side 1315 of the flexible membrane 1340, and each flexible membrane 1340 can be configured and arranged to be displaceable away from the membrane frame 1320 to contact the sensor surface 1310. In some embodiments, the flexible membrane 1340 can be sized to be displaceable away from the membrane frame 1320 to contact the sensor surface 1310 under the differential pressure between the sample side 1305 and the sensor side 1315 of the flexible membrane 1340. In certain embodiments, the sensor surface 1310 can be a nitrogen-vacancy (NV) diamond sensor surface 1310, and the optical imaging system 1302 images fluorescence emitted from the NV diamond sensor surface 1310. FIG. 13B shows an array of membranes 1340, such as 8, 24, or 96 membranes 1340, packaged in a sample cartridge 1301 that interfaces with the optical system 1302 that is configured to process multiple samples. As shown in FIGS. 13A and 13B, in one aspect, the sensor system 1300 also includes a membrane frame carrier 1360 that is secured to the membrane frame 1320. The membrane frame carrier 1360 is secured to the membrane frame 1320 using materials and methods similar to those described above for securing the membrane frame carrier 1260 to the membrane frame structure 1220. The membrane frame carrier 1360 can be made of any non-magnetic and impermeable rigid material, such as alumina having a thickness in a range of between 0.25 mm and 5 mm, such as 1 mm. The flexible membrane 1340 can be one of a silicon nitride flexible membrane, a crystalline silicon flexible membrane, a silicon dioxide flexible membrane, an amorphous carbon flexible membrane, a graphene flexible membrane, a boron nitride flexible membrane, a metal flexible membrane, or a polymer flexible membrane. The flexible membrane 1340 can be functionalized on the sample side 1305 to interact with a sample 1330. In some embodiments, the sample cartridge 1301 can further include a membrane support mesh over the flexible membrane 1340 on the sample side 1305 of the flexible membrane 1340, similar to the membrane support mesh 1145 shown in FIGS. 11A-11B and described above. In certain embodiments, the flexible membrane 1340 can be a silicon nitride flexible membrane 1340 having a thickness in a range of between 30 nm and 500 nm, such as 200 nm. In some embodiments, the flexible membrane 1340 can be displaced to a distance at a center of the flexible membrane 1340 up to 100 µm, such as 25 µm or 50 µm, away from the membrane frame 1320. In some embodiments, the flexible membrane 1340 can be displaced away from the membrane frame 1320 to contact the sensor surface 1310 under the differential pressure between the sample side 1305 and sensor side 1315 of the flexible membrane 1340. The differential pressure can be in a range of between 0.1 kPa and 1000 kPa, such as between 100 kPa and 1000 kPa.

As shown in FIGS. 13A and 13B, in one aspect, the membrane frame carrier 1360 removably engages and forms a seal with a flexible bladder 1365 that is disposed around an optical element 1303 of the optical system 1302 that images fluorescence emitted from the NV diamond sensor surface 1310. The flexible bladder 1365 includes a gas inlet 1370 for pressurizing the sample side 1305 of the flexible membrane 1340. The flexible bladder 1365 can be made from a variety of relatively low durometer rubber compounds, cast urethane, or injection molded thermoplastics that are sufficiently resilient to form an airtight seal when the optical element 1303 is pressed down against the membrane frame carrier 1360. Spacers 1325 are provided on the sensor substrate 1312 alongside the sensor surface 1310, to position the membrane frame 1320 and to keep the flexible membrane 1340 and the membrane frame 1320 from coming in contact with the sensor surface 1310 before pneumatic actuation. The sensor surface 1310 can be recessed below the level of the spacers 1325, as shown in FIG. 13A, or level with the spacers 1325, or protruding above the spacers 1325 to a height that does not cause rupture of the flexible membrane 1340. As shown in FIG. 13B, the optical system 1302 also includes a dust-off tube 1375 that blows clean air or nitrogen across the sensor surface 1310 when the sample cartridge 1301 is not in place.

Figure 14:
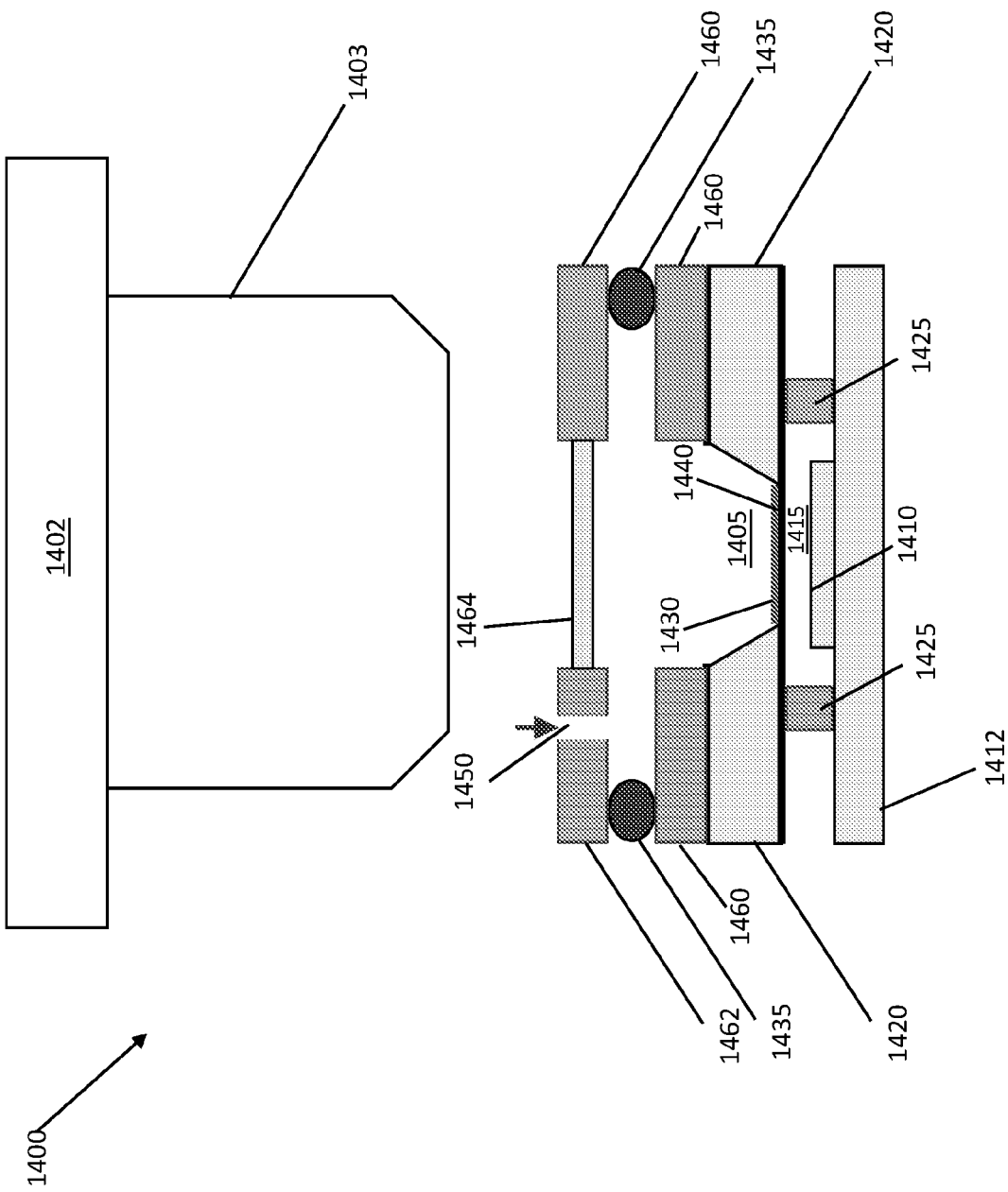
FIG. 14 is a simplified cross-section view illustrating a sensor system including a sample cartridge cap in accordance with one or more embodiments.

As shown in FIG. 14, in another aspect, a sensor system 1400 further includes a sample cartridge cap 1462 removably positioned over the membrane frame or membrane frame structure 1420 and membrane frame carrier 1460, forming a seal with the membrane frame 1420 and gasket 1435, the sample cartridge cap 1462 including a window 1464 over at least a portion of the flexible membrane 1440 and sample well 1430. In some embodiments, the sample cartridge cap can include a plurality of windows over a corresponding plurality of flexible membranes. The sample cartridge cap further includes a gas inlet 1450 for pressurizing the sample side 1405 of the flexible membrane 1440. In some embodiments, the differential pressure can be in a range of between 0.1 kPa and 1000 kPa, such as in a range of between 100 kPa and 1000 kPa. The membrane frame carrier 1460 can include a plurality of membranes 1440, such as 96 membranes. In certain embodiments, the membrane frame carrier 1460 can be made of alumina having a thickness in a range of between 0.25 mm and 5 mm, such as 1 mm. FIG. 14 also shows an optical element 1403 of the optical imaging system 1402 that images fluorescence emitted from the NV diamond sensor surface 1410 that is positioned on sensor substrate 1412, between spacers 1425.

An advantage of the flexible bladder 1365 shown in FIG. 13A over the sample cartridge cap 1462 shown in FIG. 14 is that the sample cartridge cap 1462 includes the window 1464, in addition to the optical element 1403. The additional window 1464 can degrade the image quality, even though it is transparent to the light emitted from the sensor, as described above. Integrating the flexible bladder 1365 with the optical element 1303 also reduces the complexity of the sensor system 1300.

Figure 15A:
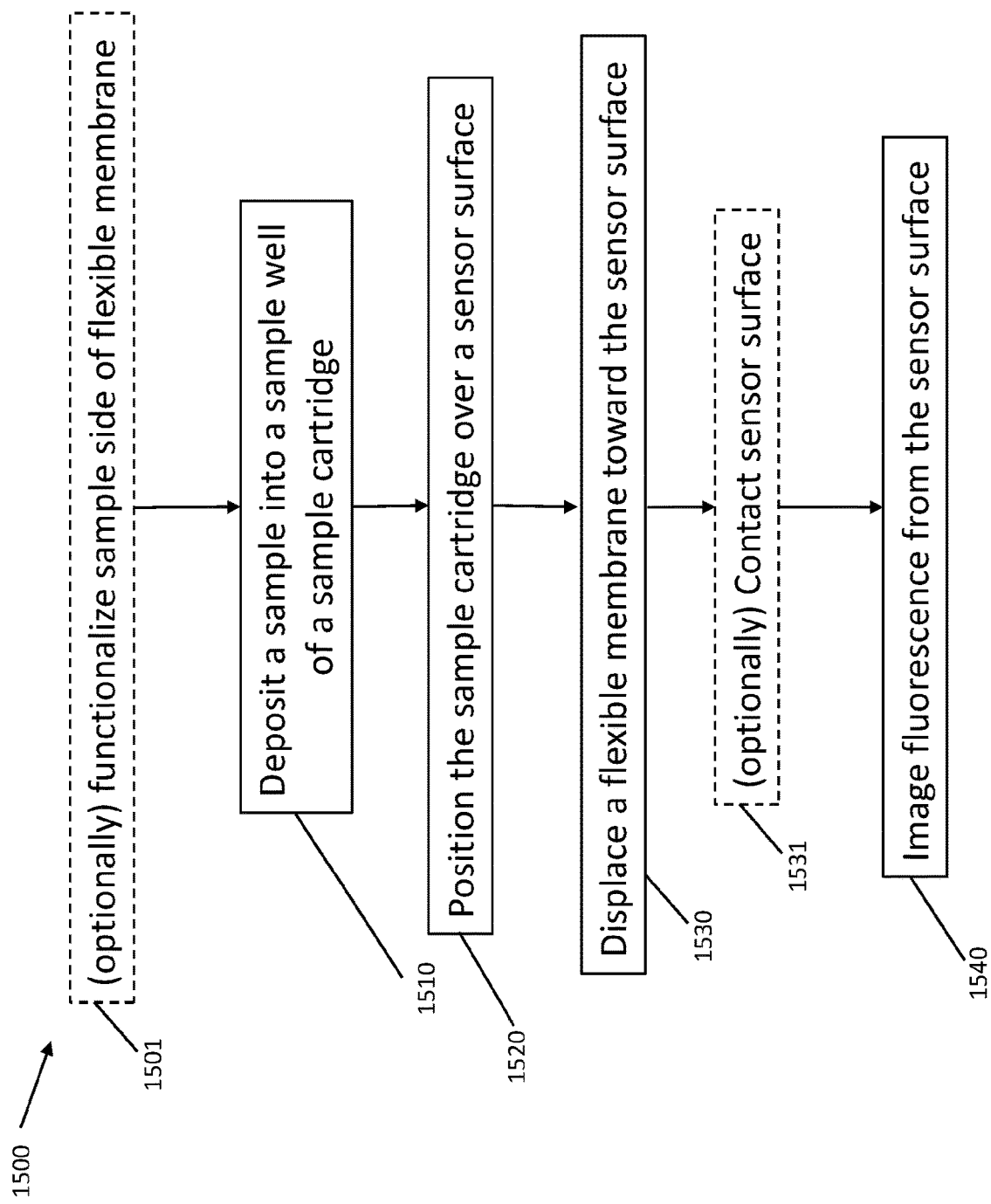
FIG. 15A is a flow chart of a method of performing an assay in accordance with one or more embodiments.
Figure 15B:
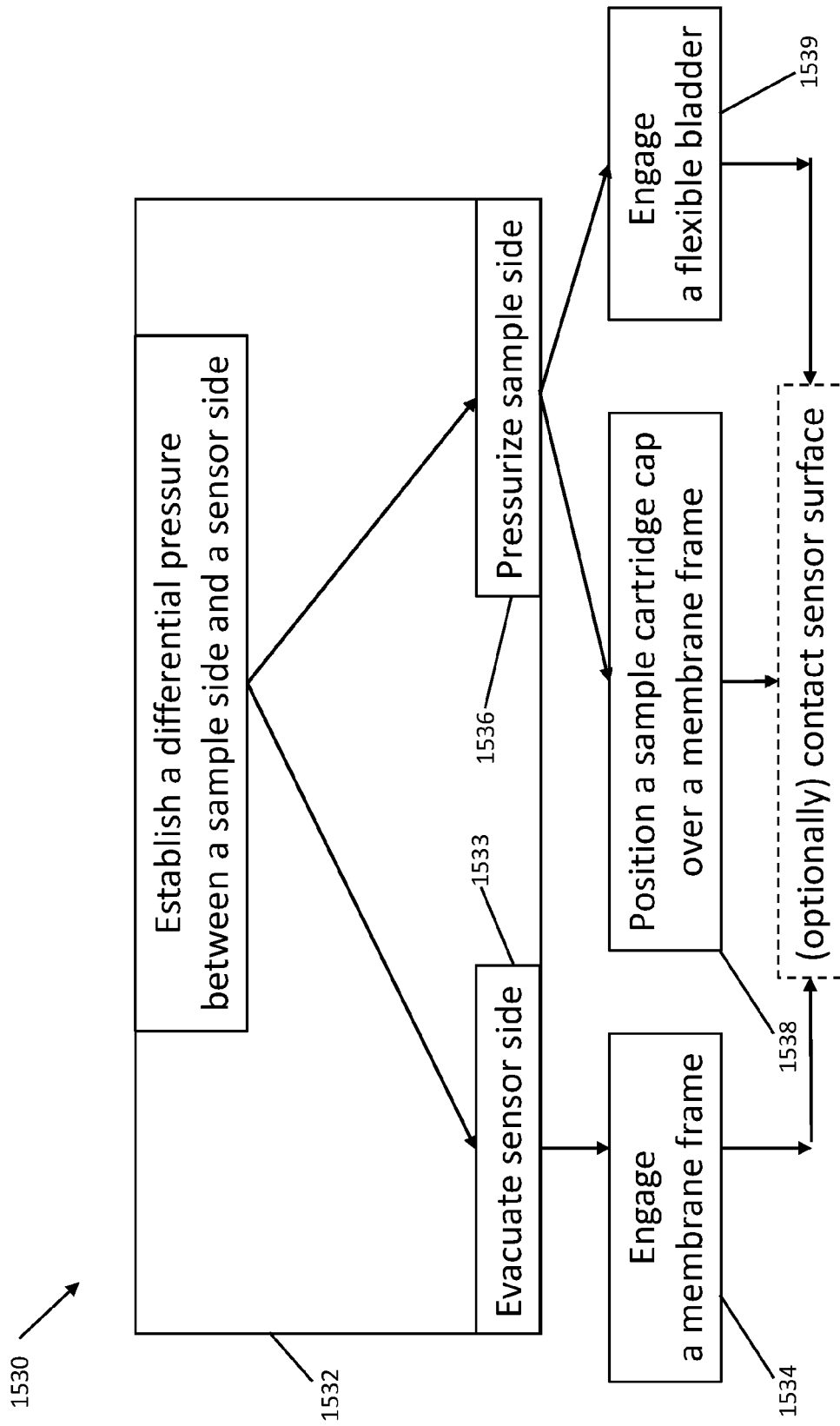
FIG. 15B is a flow chart of displacing a flexible membrane away from the membrane frame toward a sensor surface in accordance with one or more embodiments.

In accordance with one or more embodiments, as shown in FIGS. 15A and 15B, an example of a method 1500 of performing an assay includes depositing 1510 a sample into a sample well of a sample cartridge, the sample well defined by a flexible membrane and a membrane frame or membrane frame structure having an opening sealed by the flexible membrane, the flexible membrane having a sample side supporting the sample and an opposite sensor side, positioning 1520 the sample cartridge over a sensor surface such that the sensor side of the flexible membrane faces the sensor surface, displacing 1530 the flexible membrane toward the sensor surface such that the sample is moved to a position closer to the sensor surface, and imaging 1540 fluorescence emitted from the sensor with an optical imaging system when the sample is in the position closer to the sensor surface. In some embodiments, the method 1500 can further include functionalizing 1501 the sample side of the flexible membrane to interact with the sample. In certain embodiments, displacing 1530 the flexible membrane can include displacing the flexible membrane to a distance at a center of the flexible membrane up to 100 µm, such as up to 50 µm. In some embodiments, displacing 1530 the flexible membrane can include displacing the flexible membrane to contact 1531 the sensor surface. In certain embodiments, as shown in FIG. 15B, displacing 1530 the flexible membrane includes establishing 1532 a differential pressure between the sample side and the sensor side of the flexible membrane. In some embodiments, establishing 1532 the differential pressure can include evacuating 1533 the sensor side of the flexible membrane. In certain embodiments, the differential pressure can be in a range of between 0.1 kPa and 100 kPa, such as between 0.1 kPa and 50 kPa, or between 1 kPa and 10 kPa. In some of these embodiments, evacuating 1533 the sensor side of the flexible membrane can include engaging 1534 the membrane frame with a gasket to form a seal around a perimeter of the membrane frame. In certain embodiments, establishing 1532 the differential pressure can include pressurizing 1536 the sample side of the flexible membrane. In some of these embodiments, the differential pressure can be in a range of between 0.1 kPa and 1000 kPa, such as between 100 kPa and 1000 kPa. Pressurizing 1536 the sample side of the flexible membrane can include removably positioning 1538 a sample cartridge cap over the membrane frame to form a seal with the membrane frame, the sample cartridge cap including a window over at least a portion of the flexible membrane. In certain other embodiments, pressurizing 1536 the sample side of the flexible membrane can include removably engaging 1539 a flexible bladder with the sample cartridge to form a seal with the sample cartridge, the flexible bladder being disposed around an optical element of the optical imaging system.

Silicon Nitride Membrane

In accordance with one or more embodiments, silicon nitride is used to fabricate robust membranes using standard semiconductor fabrication techniques for high-volume production. Briefly, a thin film of silicon nitride can be deposited onto silicon wafers using low-pressure chemical vapor deposition (LPCVD). See Grant, A. W., Hu, Q.-H., and Kasemo, B., Transmission electron microscopy windows for nanofabricated structures, *Nanotechnology* 15, 1175-1181 (2004); and Ciarlo, D. R., Silicon nitride thin windows for biomedical microdevices, *Biomed. Microdevices* 4, 63-68 (2002), which are incorporated by reference herein. The deposition process can be optimized to result in low residual stress in the silicon nitride film. The back side of the silicon wafer can be lithographically patterned to define the desired membrane and frame geometry, followed by anisotropic etching along the (100) silicon crystal direction. This process results in freestanding membranes supported by a silicon frame with edges sloped at half the tetrahedral angle α (shown in FIG. 3A) of 54.7°. FIG. 3B is a photograph of a 2 mm×2 mm silicon nitride membrane 340 of 1 µm thickness in a silicon membrane frame 320 in accordance with one or more embodiments.

The strength and deflection, also denoted herein as displacement or actuation, of silicon nitride membranes has been studied using theoretical models of membrane stress (Equation 1) and comparison to fabricated membranes. See Tabata, O., Kawahata, K., Sugiyama, S., and Igarashi, I., Mechanical property measurements of thin films using load-deflection of composite rectangular membranes. *Sensors and Actuators* 20, 135-141 (1989); and Maier-Schneider, D., Maibach, J., and Obermeier, E. A., New Analytical Solution for the Load-Deflection of Square Membranes. *J. Microelectromechanical Syst.* 4, 238-241 (1995), which are incorporated by reference herein. For a square membrane with $v=0.25$, $C_1$ and $C_2$ are approximately 3.45 and 2.48, respectively. FIGS. 16A, 16B, and 16C show graphs of membrane deflection as a function of differential pressure using Equation 1 for membrane thicknesses t of 100 nm, 300 nm, and 1000 nm, respectively. The three rows show graphs for three different values (0.5 mm, 1.5 mm, and 5.0 mm) of the membrane half width a (i.e., the membrane lateral size is 2a). The three lines in each graph correspond to three different values of internal tensile stress σ ($\sigma_1=0$ MPa, $\sigma_2=200$ MPa, $\sigma_3=500$ MPa). Other membrane geometries (circular, rectangular, etc.) exhibit similar deflection, with modified constants $C_1$ and $C_2$. The internal tensile stress a depends on the manufacturing process and can be engineered in a range of 0 MPa to 1500 MPa with precision of 200 MPa or better. The stress can also be negative (i.e., compressive stress), which can cause the membrane surface to fold into ripples. Positive tensile stress may provide a flatter and smoother membrane surface in the absence of differential pressure. Low tensile stress, such as σ=200 MPa or less, enables greater membrane deflection at low differential pressure, as shown in FIGS. 16A, 16B, and 16C.

The membrane geometry, including the shape, lateral size, and thickness of the membrane, can be adjusted to suit a given measurement. The lateral size of the membrane can be determined by the size of the measurement field of view. The membrane can be larger than the field of view to be imaged, so that the field of view is not reduced by encroachment from the frame nor by the portion of the membrane at its perimeter that does not contact the sensor. Silicon nitride membranes having a lateral size in a range of between 0.1 mm and 30 mm can be used to accommodate a wide range of field of view sizes. Oversized membranes (i.e., membranes with lateral sizes larger than necessary to accommodate the field of view) can be used to increase membrane deflection, as shown in FIGS. 16A-16C.

Alternatively, minimally-sized or undersized membranes can be used to avoid physical contact of the deflected membrane with structures other than the sensor surface. For example, consider a square NV diamond sensor with lateral dimensions of 2 mm×2 mm. In this case, the membrane can be fabricated to have a lateral size less than 2 mm to ensure that, when properly positioned, the deflected membrane will not touch edges or corners of the sensor, which can lead to rupture.

The shape of the membrane can also be adjusted to the measurement field of view. For some membrane fabrication technologies, certain shapes can be more straightforward to produce, can produce a membrane with more favorable characteristics such as intrinsic stress or uniformity, or can result in a deflected membrane profile that is better suited to the measurement field of view. In an example embodiment of silicon nitride membranes fabricated on crystalline silicon wafer membrane frames, anisotropic process steps used for membrane fabrication can favor a square or rectangular window rather than a circular window.

The thickness of the membrane can be adjusted to achieve appropriate deflection under a reasonable differential pressure (Equation 1), if the membrane shape, lateral size, and material are independently determined to suit the needs of the measurement.

The lithographic process of removing the silicon substrate to create the silicon nitride membrane geometry can be straightforwardly scaled to produce 8, 24, 96, or any number of membranes.

Exemplification of a Sample Transfer Procedure

In accordance with one or more embodiments, sample measurement using a sample transfer flexible membrane can be performed as follows:

1. Each of one or more samples is loaded onto a sample transfer flexible membrane, with one sample per membrane. There may be many membranes at different sample wells in a single sample cartridge, so that many samples can be loaded at one time into the cartridge. Samples can be loaded as a liquid suspension and allowed to dry on the membrane.
2. The sample cartridge is installed in the measurement instrument.
3. One sample well of the sample cartridge is located over the sensor by moving an XY stage to the appropriate position.
4. The sample cartridge is lowered so that the gasket at the cartridge perimeter seals to the sensor support substrate. When the gasket is compressed, spacers inhibit the membrane and membrane frame from corning into contact with the sensor, leaving a small gap between the membrane and sensor of about 5-100 µm. The space between the sample cartridge and the sensor support substrate, including the gap between the sample transfer membrane and the sensor, is referred to herein as the vacuum chamber.
5. The vacuum chamber is partially evacuated by pumping on the vacuum chamber pump line. The differential pressure across the membrane displaces it toward the sensor so that the membrane comes in contact with the sensor. This process is referred to herein as actuating the membrane. The vacuum chamber pressure is chosen to be low enough so that the contact area with the sensor is larger than the measurement field of view, but not so low that the differential pressure across the membrane causes the membrane to burst.
6. The sample measurement proceeds with the membrane in contact with the sensor, holding the pressure steady enough to maintain contact between the membrane and sensor across the measurement field of view.
7. After measurement, the vacuum chamber is vented and the membrane relaxes back to a state of minimal displacement. This is referred to herein as releasing the membrane.
8. The sample stage translates the sample cartridge vertically away from the sensor, opening the gasket seal.
9. Steps 3-8 are repeated for a different sample well.

In accordance with one or more embodiments, the measurement instrument can contain multiple sensors to allow multiple sample transfer membranes at multiple sample wells of the sample cartridge to interface with the multiple sensors in parallel at the same time in a single membrane actuation step. Actuating membranes in parallel with fewer total membrane actuation steps can reduce the complexity of the measurement instrument and sample transfer membrane actuation apparatus, and reduce the number of times an individual membrane is actuated to reduce the chance of membrane degradation or failure. Measurements of multiple samples on multiple membranes interfaced to multiple sensors can be performed one after another in series, or simultaneously in parallel.

When all samples have been measured, the sample cartridge can be removed from the measurement instrument. The cartridge can be stored for future measurements, cleaned to remove the samples so that new samples can be loaded, using a cleaning procedure suitable for the intended measurements, or discarded, as appropriate for disposable single-use sample cartridges. A disposable sample cartridge can include the sealing gasket, imaging window, pump line, or other components involved in installing the sample cartridge or in interfacing one or more membrane-supported samples with the sensor, such that all components of the sample cartridge are disposable. A disposable sample cartridge can be readily separated from any portion or component of the measurement instrument without contamination, degradation, or otherwise compromising the measurement instrument and the ability to make future measurements.

Exemplification of a Sample Loading Procedure

The membrane and sensor should be kept clear of dust and other particles that can interfere with bringing the membrane in close contact with the sensor surface. In accordance with one or more embodiments, as shown in FIG. 17A, before use, the sample cartridge 1700 can be stored with a protective cover 1770A-B to prevent contamination. During sample loading, the sample side 1705 of the flexible membrane 1740 is exposed by removing the protective cover 1770A, as indicated by the arrow shown in FIG. 17A, to allow the sample 1730 to be loaded onto the membrane surface 1740, while the sensor side 1715 of the flexible membrane 1740 remains protected by cover 1770B, as shown in FIG. 17B. The sensor side 1715 of the flexible membrane 1740 is finally exposed by removing the protective cover 1770B, as indicated by the arrow shown in FIG. 17C, just before the sample cartridge 1700 is inserted into the instrument for measurement, or during insertion. Other approaches can be alternatively or additionally employed to mitigate dust or otherwise ensure cleanliness of the sensor and membrane surfaces. These include air filtration, maintaining positive pressure in the region of the measurement instrument containing the sensor during the times when the sample cartridge is not in place, mitigation or trapping of dust by electrostatic forces, use of air or gas jets to remove accumulated dust, and sensor wiping with or without solvents.

In accordance with one or more embodiments, samples comprising liquid suspensions of magnetic particles or other magnetic material can be optimized for dispersal onto the sample transfer membrane. In addition, the sample transfer membrane surface can be chemically treated or coated to ensure a specific interaction with the liquid sample. This includes application of hydrophilic or hydrophobic coatings to engineer specific wetting characteristics of the sample. In addition, or alternatively, the sample side of the membrane can be functionalized with an array or pattern to help the magnetic particles dry in the same pattern. The patterns, grids, or irregular arrangements could be applied with a laser printer. Patterns, grids, or irregular arrangements can help in more quickly identifying dimers or monomers and can reduce or prevent false binding events that can occur during the drying process.

In addition to sample dispersal, membrane coatings in accordance with one or more embodiments can aid applications that are sensitive to surface interactions. Hydrophobic patches could attract air bubbles which can negatively affect sample processing and measurement. Hydrophobic patches could also carry charge that attracts sample components including nucleic acids, affecting accuracy and precision of related measurements.

In accordance with one or more embodiments, a sample suspension buffer can include salts, surfactants, proteins, or other components to aid in avoiding or promoting aggregation of magnetic particles. The sample transfer membrane surface can be functionalized, textured, deformed, or otherwise modified during sample loading to affect dispersal, aggregation, orientation, interaction, or other processes and properties of the sample that can affect the subsequent magnetic measurement.

In accordance with one or more embodiments, magnetic fields, electric fields, temperature, pressure, stress, light, and other externally-applied treatments can be applied to the sample during and/or after loading onto the sample transfer membrane to induce a response in the subsequent magnetic measurement. These treatments can be static or time-varying and can be applied uniformly over the sample or in a spatially varying manner. Examples include: (1) Magnetization of the sample after loading with an applied magnetic field at a particular direction and magnitude, or a sequence of applied magnetic fields; (2) Orientation or induced aggregation of magnetic particles in a liquid sample suspension by application of a magnetic field; (3) Heating and/or cooling of the sample; and (4) Mechanical agitation of the sample by inducing displacement of the membrane.

Exemplification of a Membrane Actuation Procedure

Figure 18:
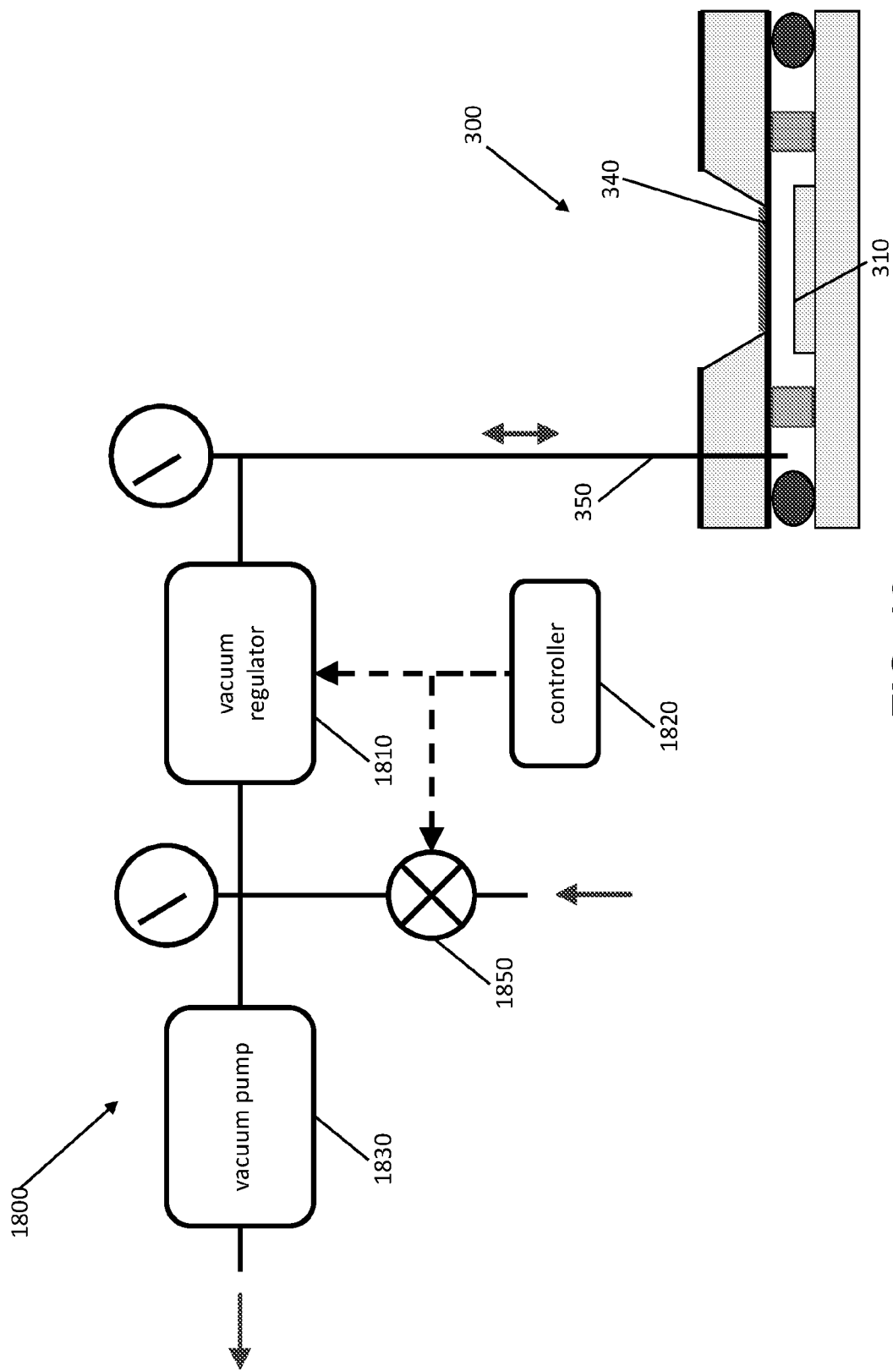
FIGS. 18, 19, and 20 illustrate vacuum system schematics for displacement mechanisms for pneumatically actuating the sample transfer flexible membrane in accordance with one or more embodiments.
Figure 19:
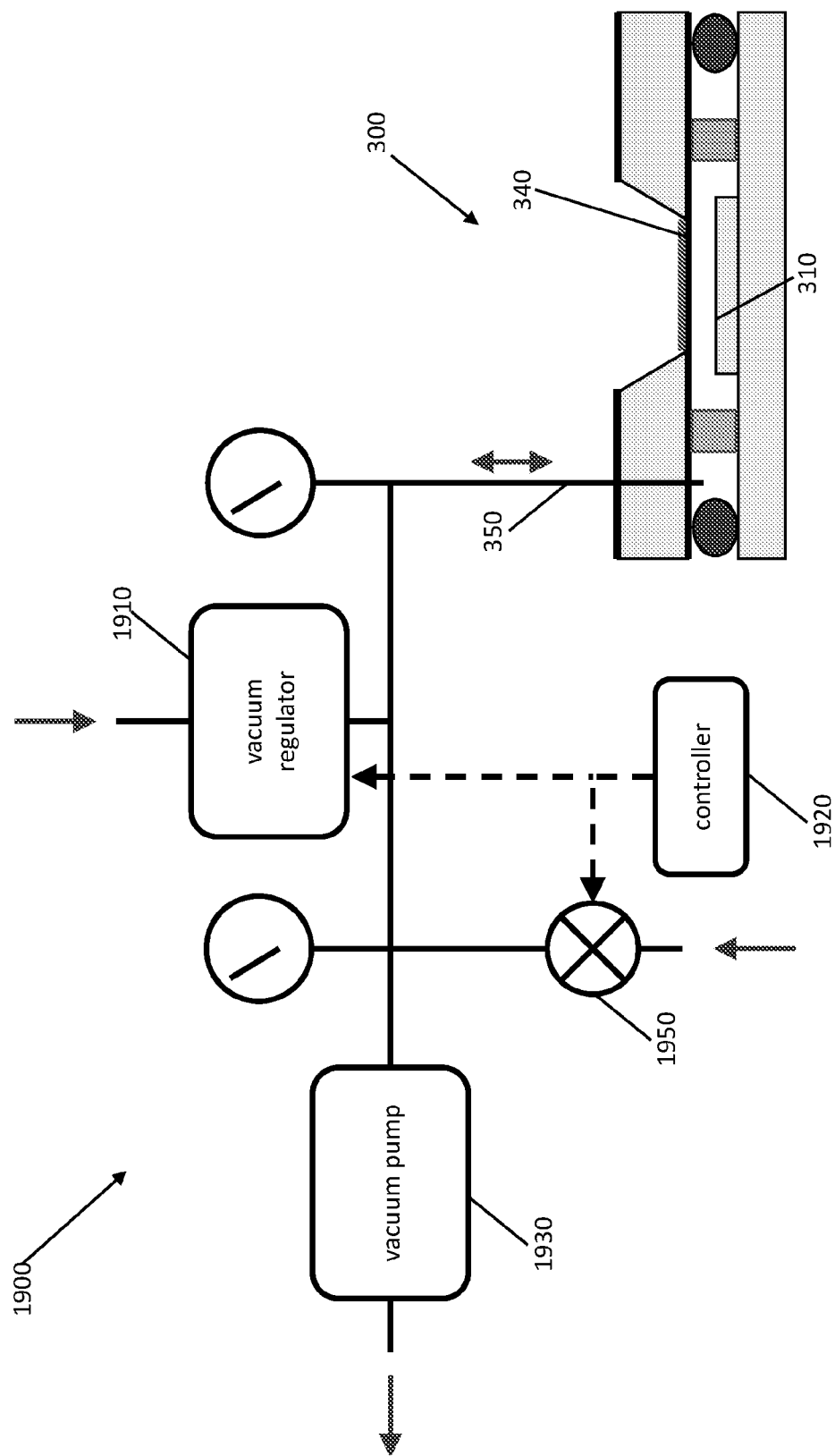
Figure 20:
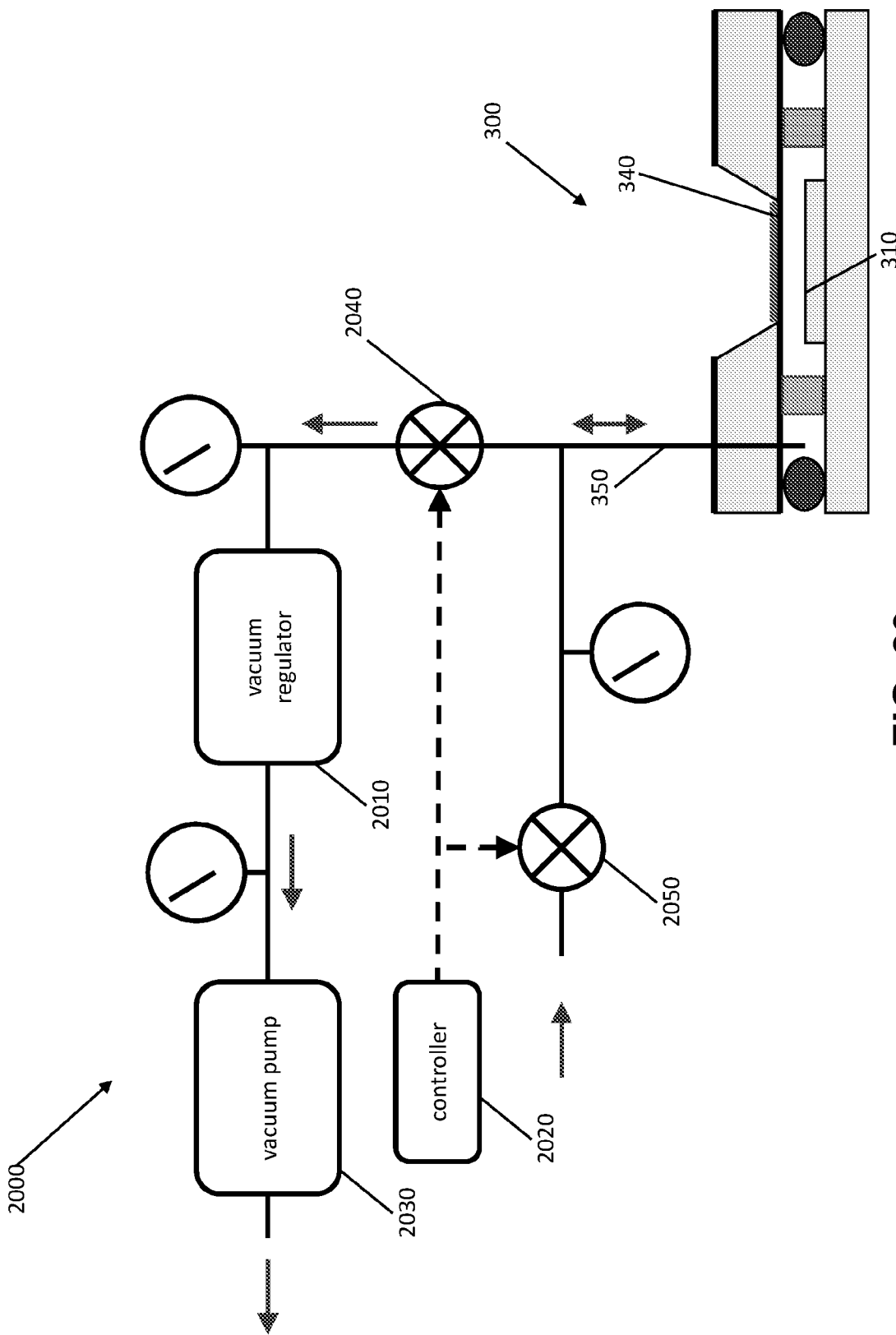

FIGS. 18, 19, and 20 schematically illustrate various displacement mechanisms including vacuum systems for pneumatically actuating the sample transfer membrane 340 against the sensor surface 310 of the sample cartridge 300 (shown in FIG. 3A) in accordance with one or more embodiments.

The displacement mechanisms 1800 and 1900 shown in FIGS. 18 and 19 include a vacuum regulator 1810, 1910, respectively, that is actively controlled by a controller 1820, 1920, respectively, to set the vacuum chamber pressure. In the displacement mechanism 1800 shown in FIG. 18, the vacuum regulator 1810 is in-line with the vacuum pump 1830.

In the displacement mechanism 2000 shown in FIG. 20, an in-line vacuum regulator 2010 maintains a consistent vacuum pressure. The vacuum chamber is pumped to this vacuum pressure and later vented by actively controlling actuation valve 2040 and vent valve 2050, respectively, to actuate and subsequently release the membrane 340.

Figure 21:
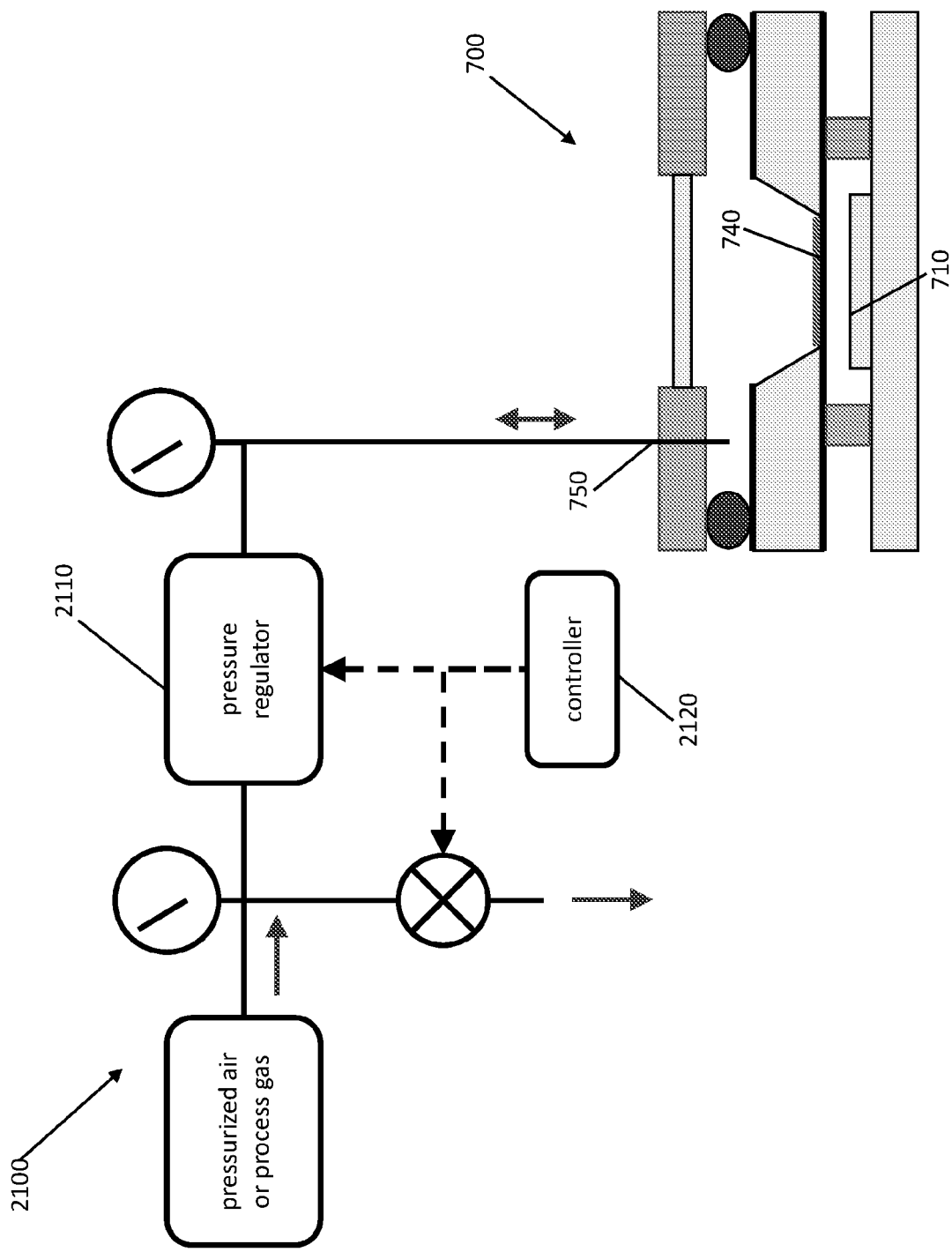
FIGS. 21 and 22 illustrate pressure system schematics for displacement mechanisms for pneumatically actuating the sample transfer flexible membrane in accordance with one or more embodiments.
Figure 22:
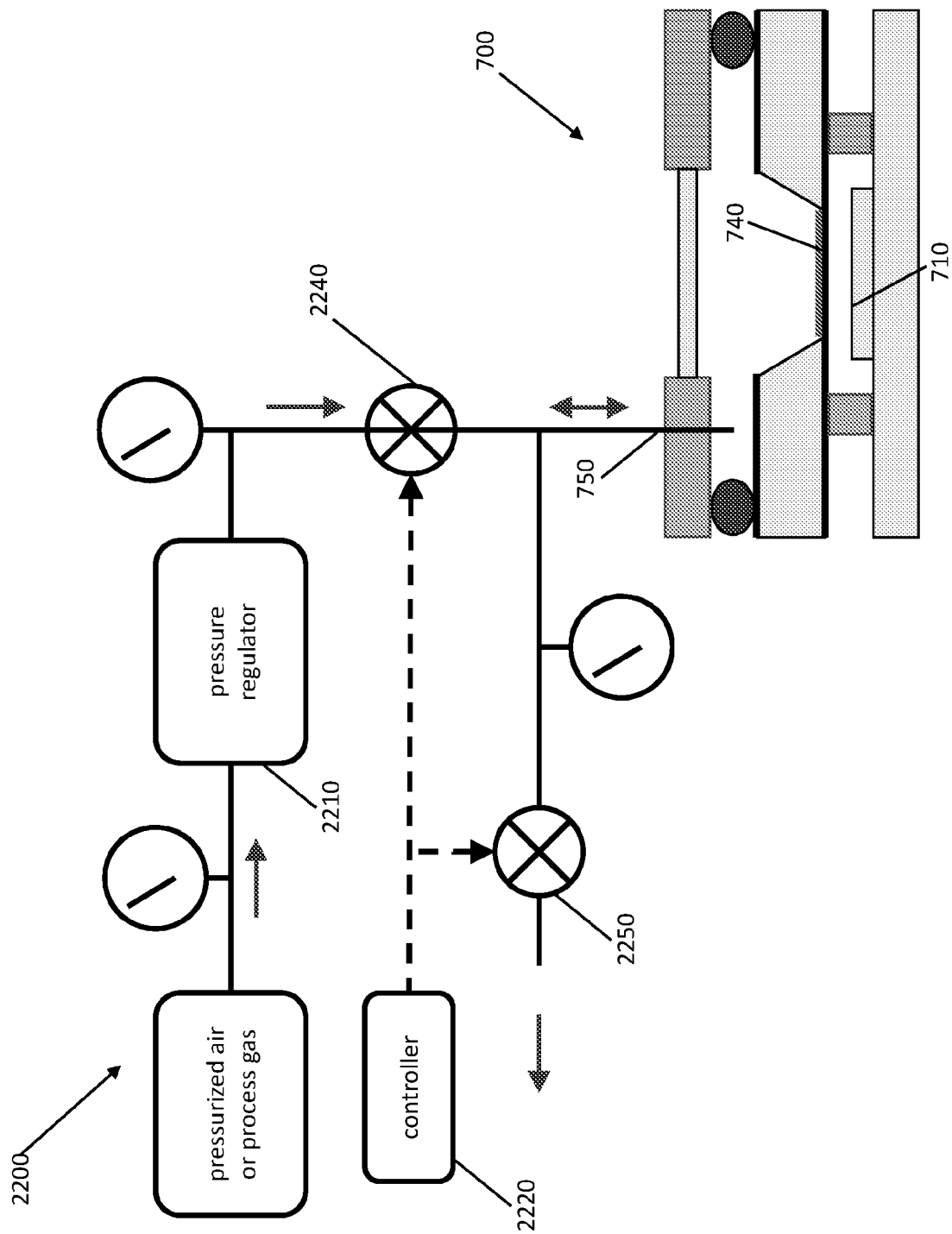

FIGS. 21 and 22 schematically illustrate various displacement mechanisms including positive pressure systems for pneumatically actuating the sample transfer membrane 740 against the sensor surface 710 of the sample cartridge 700 (shown in FIG. 7) in accordance with one or more embodiments.

The displacement mechanism 2100 shown in FIG. 21 includes a pressure regulator 2110 that is actively controlled by controller 2120 to set the sample cartridge pressure.

In the displacement mechanism 2200 shown in FIG. 22, an in-line pressure regulator 2210 maintains a consistent pressure. The sample cartridge is pressurized to this pressure and later vented by actively controlling actuation valve 2240 and vent valve 2250, respectively, with controller 2220, to actuate and subsequently release the membrane 740.

When displacing the membrane toward the flat surface of the diamond sensor, the spatial profile of the displaced membrane can be inferred from interference of light reflected from the diamond and membrane surfaces. One method is to illuminate with narrow-band light from behind the diamond sensor, so that the light passes through the diamond, the gap above the diamond, and then the membrane above it before being collected by an imaging system such as an optical microscope. Light reflected from the membrane and diamond surfaces interferes to produce dark and light fringes in the image where the interference is destructive or constructive, respectively. Consecutive dark fringes occur when the gap between the diamond and membrane has changed by a half-integer multiple of the optical wavelength.

Figure 23:
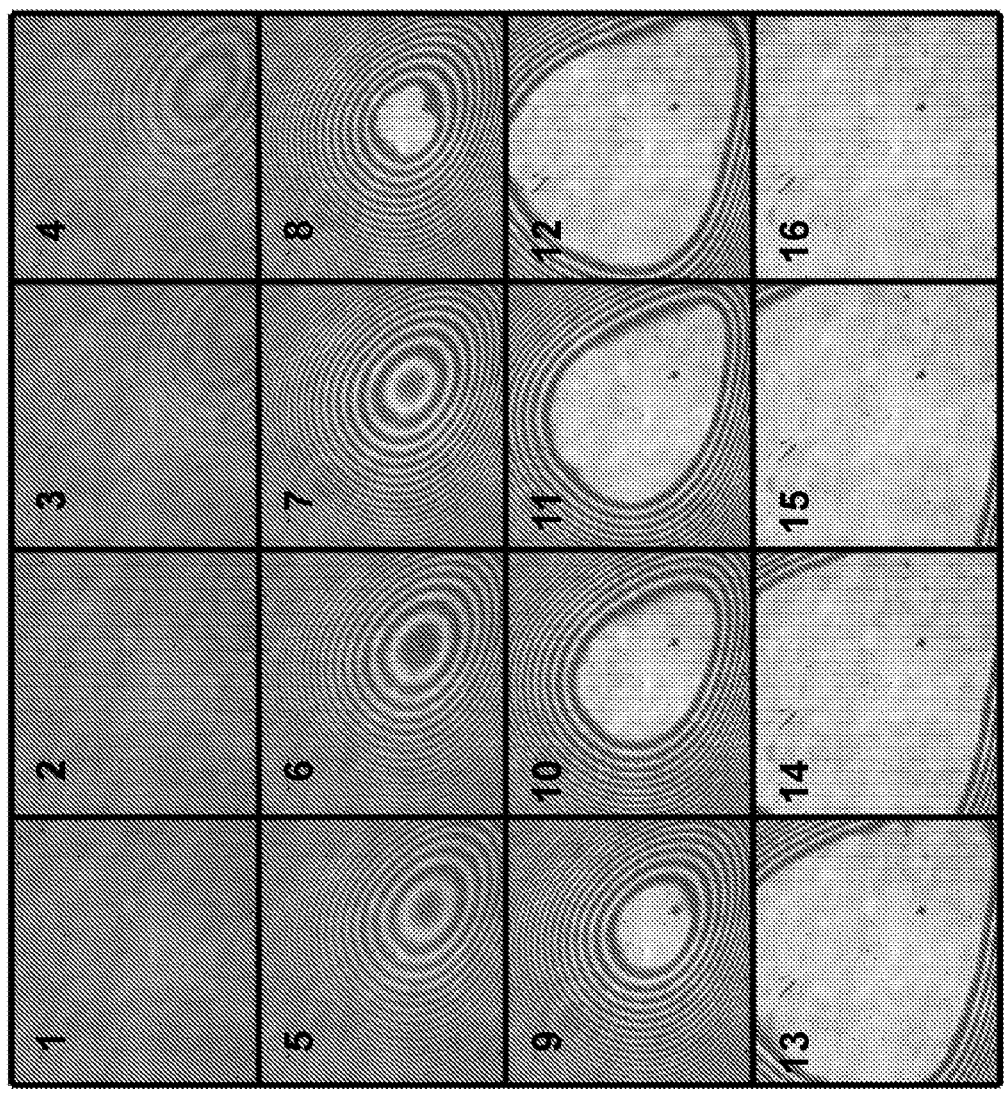
FIG. 23 shows optical images of narrow-band light (wavelength 651±4 nm) transmitted through a diamond sensor and a 500-nm thick silicon nitride membrane in accordance with one or more embodiments.

FIG. 23 illustrates various optical images of narrow-band light (wavelength 651±4 nm) transmitted through a diamond sensor and 500-nm thick silicon nitride membrane. These fringe images may be used to characterize the contact region and identify locations in which the gap between the membrane and diamond sensor may be large enough to significantly affect magnetic imaging of the sample in that location. The sequence (1)-(16) in FIG. 23 corresponds to a monotonic increase in the membrane differential pressure from zero to 10 kPa. The image is focused on the diamond sensor surface. The sensor and membrane surfaces produce reflections. Light and dark interference fringes are visible where these reflections interfere constructively and destructively, respectively, depending on the local air gap between membrane and sensor. The membrane profile can be inferred from the fringes. A dark spot is visible where a particle rests between the membrane and diamond sensor.

Spacers around the diamond sensor may be used to ensure that the membrane and its frame do not collide with the diamond sensor when the sample cartridge is lowered to seal the vacuum chamber. A spacing of 5-100 µm may be engineered using machined parts with reasonable tolerances. Such a spacing is within a reasonable deflection range for a thin membrane under 1-10 kPa differential pressure, as shown in FIGS. 16A-16C.

In accordance with one or more embodiments, the spacers may be engineered such that the sensor surface is proud of or protruding above the surface defined by the spacers, such that the membrane makes contact with the sensor surface when the membrane frame is brought into contact with the spacers, before a differential pressure is applied. A differential pressure can subsequently be applied to displace the entire membrane further against the sensor to increase the contact area. Having the sensor proud of or protruding above the spacers reduces the required membrane displacement to achieve a given contact area, enabling membrane actuation at reduced differential pressure. However, if the proud sensor surface can make contact with the membrane before the membrane frame is brought securely into contact with the spacers, then a small lateral motion of the membrane relative to the sensor can damage the membrane as it is brought into position. The chance of damage will be reduced by ensuring that the membrane and membrane frame are brought smoothly into contact along the direction normal to the sensor surface. Additionally, the membrane lateral size must be sufficiently larger than the proud sensor surface to prevent the sensor edge from damaging the membrane at the point of contact. The sensor edges may be rounded, beveled, or otherwise shaped to reduce the concentration of mechanical stress in the membrane caused by contact with the sensor.

Exemplification of a Magnetic Imaging Procedure of Membrane-Supported Samples

The nonmagnetic sample transfer membrane does not affect the magnetic field produced by the sample. The sample is not imaged "through" the membrane, but rather the magnetic fields produced by the sample permeate the membrane unperturbed and are imaged at the diamond sensing surface. As such, there is no distortion of the magnetic image simply due to the presence of the membrane. However, since the sample is mechanically supported by the membrane, variations in membrane position and thickness may result in variations in the relative distance between the sample and the diamond sensor, with corresponding variation in the strength and spatial profile of the magnetic field at the sensor surface. This variation is apparent in FIGS. 24a-24e, which show decreased magnitude and a broader spatial pattern for the magnetic field produced with increasing separation between the sample and the sensor surface.

FIGS. 24a-24e show portions of magnetic images obtained with wide-field diamond magnetic imaging, showing dipole signals from magnetic particles magnetized horizontally. (a) Particles deposited directly onto the diamond sensor; (b-e) four images of a consistent set of three particles supported by a 500-nm membrane at diamond-membrane separations of (b) 0 µm, (c) 3 µm, (d) 6 µm, (e) 30 µm. Field of view is 45 µm. Gray scale: (a-c) 36 µT, (d-e) 11 µT. Images in (d-e) are spatially filtered for clarity. FIG. 24(f) is a graph of dipole distances extracted from fits to a dipole model of ≈100 particle images, compared to distances determined independently from image focus. Points correspond, in ascending order, to images that contain the portions shown in FIGS. 24(a-d), respectively. Fitted distances exceed actual distances due to the finite thickness of the NV-rich sensing layer and finite spatial resolution.

Exemplification of an Optical Transmission Procedure Through Sample Transfer Membrane When the sample transfer membrane is in place over a diamond sensor, magnetic imaging signal light (NV center fluorescence from the diamond sensor) passes through the membrane before being collected by an objective lens. This signal light reflects from the top and bottom surfaces of the membrane. Reflected signal light additionally reflects again from the diamond sensor surface, and so on.

The resulting interference can be constructive or destructive (more or less transmission of signal light, respectively) depending on the index of refraction of the membrane, thickness of the membrane, and size of the air gap between the membrane and diamond sensor. Variations in these parameters over the imaging field of view can cause variations in signal light intensity, and consequently localized degradation of magnetic imaging sensitivity.

For a given optical wavelength, it is possible to choose a membrane thickness to maximize constructive interference, such that negligible reflection occurs from the membrane. This is a common technique for construction of non-reflective optical coatings. However, since the NV center emission spectrum is rather broad (spanning over 100 nm), controlling only the membrane thickness can provide only imperfect suppression of signal light reflection. For example, a silicon nitride membrane with index of refraction of approximately 2.1 in the optical wavelength range of 650-800 nm will ensure that over 90% of signal light is transmitted through the membrane.

Further Example Embodiments

Example 1 is a cartridge cassette for use with a sensor in performing an assay that includes a membrane frame carrier having two or more openings, and a membrane frame structure secured to one side of the membrane frame carrier, the membrane frame structure including two or more openings, each at least partly coincident with a different opening in the membrane frame carrier, and two or more flexible membranes, each covering and sealing a different one of the two or more openings in the membrane frame structure to define two or more sample wells, each flexible membrane having a sample side supporting a sample and an opposite sensor side, each flexible membrane configured and arranged to be displaceable away from the membrane frame such that the sample is moved to a position closer to a sensor surface of the sensor under a differential pressure between the sample side and the sensor side of the flexible membrane.

Example 2 includes the subject matter of Example 1, wherein the sensor surface is a nitrogen-vacancy (NV) diamond sensor surface.

Example 3 includes the subject matter of any of Examples 1-2, wherein each flexible membrane is functionalized on the sample side to interact with a sample.

Example 4 includes the subject matter of any of Examples 1-3, wherein each flexible membrane is one of a silicon nitride flexible membrane, a crystalline silicon flexible membrane, a silicon dioxide flexible membrane, an amorphous carbon flexible membrane, a graphene flexible membrane, a boron flexible membrane, a metal flexible membrane, or a polymer flexible membrane.

Example 5 includes the subject matter of Example 4, wherein each flexible membrane is a silicon nitride flexible membrane having a thickness in a range of between 30 nm and 500 nm.

Example 6 includes the subject matter of Example 5, wherein the thickness of each silicon nitride flexible membrane is 200 nm.

Example 7 includes the subject matter of any of Examples 1-6, wherein each flexible membrane is displaceable to a distance at a center of each flexible membrane up to 100 µm away from the membrane frame structure.

Example 8 includes the subject matter of any of Examples 1-7, wherein each flexible membrane is displaceable to a distance at the center of each flexible membrane up to 50 µm away from the membrane frame structure.

Example 9 includes the subject matter of any of Examples 1-8, wherein the pressure on the sensor side of each flexible membrane is below atmospheric pressure, and the differential pressure is in a range of between 0.1 kPa and 100 kPa.

Example 10 includes the subject matter of any of Examples 1-9, wherein the differential pressure is in a range of between 0.1 kPa and 50 kPa.

Example 11 includes the subject matter of any of Examples 1-10, wherein the differential pressure is in a range of between 1 kPa and 10 kPa.

Example 12 includes the subject matter of any of Examples 1-11, further including a sample cartridge cap configured and arranged to overlay the membrane frame structure, the sample cartridge cap including a window over at least a portion of each flexible membrane.

Example 13 includes the subject matter of Example 12, wherein the sample cartridge cap includes a plurality of windows over a plurality of flexible membranes.

Example 14 includes the subject matter of any of Examples 12-13, wherein the sample cartridge cap further includes a gas inlet for pressurizing the sample side of the flexible membrane.

Example 15 includes the subject matter of any of Examples 12-14, wherein the differential pressure is in a range of between 0.1 kPa and 1000 kPa.

Example 16 includes the subject matter of any of Examples 12-15, wherein the differential pressure is in a range of between 100 kPa and 1000 kPa.

Example 17 includes the subject matter of any of Examples 1-16, wherein each flexible membrane is configured and arranged to be displaceable away from the membrane frame structure to contact the sensor surface under the differential pressure between the sample side and the sensor side of the flexible membrane.

Example 18 includes the subject matter of any of Examples 1-17, wherein each flexible membrane is sized to be displaceable away from the membrane frame structure to contact the sensor surface under the differential pressure between the sample side and the sensor side of the flexible membrane.

Example 19 includes the subject matter of any of Examples 1-18, wherein the two or more flexible membranes comprises 96 flexible membranes.

Example 20 includes the subject matter of any of Examples 1-19, wherein the membrane frame carrier is made of alumina having a thickness in a range of between 0.25 mm and 5 mm.

Example 21 includes the subject matter of Example 20, wherein the thickness of the membrane frame carrier is 1 mm.

Example 22 includes the subject matter of any of Examples 1-21, further including a detachable pipette guide configured and arranged to overlay the membrane frame carrier, the pipette guide including a shelf configured to engage a ridge on a sample loading pipette.

Example 23 includes the subject matter of any of Examples 1-22, wherein each membrane frame structure further includes a membrane support mesh on each flexible membrane on the sample side of the flexible membrane.

Example 24 is a sensor system that includes a sensor having a sensor surface, a sample cartridge including one or more flexible membranes and a membrane frame, the membrane frame including one or more openings covered by the one or more flexible membranes defining one or more wells for holding one or more samples, the flexible membrane having a sample side supporting the sample and an opposite sensor side, the sample cartridge being removably insertable in the sensor system such that the sensor side of the flexible membrane is positioned above and faces the sensor surface, a displacement mechanism that can be actuated to displace the flexible membrane toward the sensor surface such that the sample is moved to a position closer to the sensor surface, and an optical imaging system that detects light emitted from the sensor.

Example 25 includes the subject matter of Example 24, wherein the displacement mechanism is configured and arranged to create a differential pressure between the sample side and the sensor side of the flexible membrane, and the flexible membrane is configured and arranged to be displaceable away from the membrane frame to contact the sensor surface.

Example 26 includes the subject matter of any of Examples 24-25, wherein the flexible membrane is sized to be displaceable away from the membrane frame to contact the sensor surface under the differential pressure between the sample side and the sensor side of the flexible membrane.

Example 27 includes the subject matter of any of Examples 24-26, wherein the sensor surface is a nitrogen-vacancy (NV) diamond sensor surface, and the optical imaging system images fluorescence emitted from the NV diamond sensor surface.

Example 28 includes the subject matter of any of Examples 24-27, wherein the flexible membrane is functionalized on the sample side to interact with a sample.

Example 29 includes the subject matter of any of Examples 24-28, wherein the flexible membrane is one of a silicon nitride flexible membrane, a crystalline silicon flexible membrane, a silicon dioxide flexible membrane, an amorphous carbon flexible membrane, a graphene flexible membrane, a boron flexible membrane, a metal flexible membrane, or a polymer flexible membrane.

Example 30 includes the subject matter of Example 29, wherein the flexible membrane is a silicon nitride flexible membrane having a thickness in a range of between 30 nm and 500 nm.

Example 31 includes the subject matter of Example 30, wherein the thickness of the silicon nitride flexible membrane is 200 nm.

Example 32 includes the subject matter of any of Examples 24-31, wherein the flexible membrane is displaceable to a distance at a center of the flexible membrane up to 100 μm away from the membrane frame.

Example 33 includes the subject matter of Example 32, wherein the flexible membrane is displaceable to a distance at a center of the flexible membrane up to 50 μm away from the membrane frame.

Example 34 includes the subject matter of any of Examples 24-33, wherein the sample cartridge further includes a sample cartridge cap configured and arranged to overlay the membrane frame, the sample cartridge cap including a window over at least a portion of the flexible membrane.

Example 35 includes the subject matter of Example 34, wherein the sample cartridge cap includes a plurality of windows over a corresponding plurality of flexible membranes.

Example 36 includes the subject matter of any of Examples 34-35, wherein the sample cartridge cap further includes a gas inlet for pressurizing the sample side of the flexible membrane.

Example 37 includes the subject matter of any of Examples 34-36, wherein the differential pressure is in a range of between 0.1 kPa and 1000 kPa.

Example 38 includes the subject matter of Example 37, wherein the differential pressure is in a range of between 100 kPa and 1000 kPa.

Example 39 includes the subject matter of any of Examples 24-38, wherein the sample cartridge further includes a membrane frame carrier secured to the membrane frame on the sample side of the flexible membrane.

Example 40 includes the subject matter of Example 39, wherein the optical imaging system further includes a flexible bladder around an optical element of the optical imaging system and a gas inlet for pressurizing the sample side of the flexible membrane, the flexible bladder configured and arranged to removably engage and form a seal with the membrane frame carrier.

Example 41 includes the subject matter of Example 40, wherein the differential pressure is in a range of between 0.1 kPa and 1000 kPa.

Example 42 includes the subject matter of Example 41, wherein the differential pressure is in a range of between 100 kPa and 1000 kPa.

Example 43 includes the subject matter of any of Examples 39-42, wherein the membrane frame carrier is secured to a plurality of membrane frames.

Example 44 includes the subject matter of Example 43, wherein the plurality of membrane frames comprises 96 membrane frames.

Example 45 includes the subject matter of any of Examples 39-44, wherein the membrane frame carrier is made of alumina having a thickness in a range of between 0.25 mm and 5 mm.

Example 46 includes the subject matter of Example 45, wherein the thickness of the membrane frame carrier is 1 mm.

Example 47 includes the subject matter of any of Examples 24-46, wherein the sample cartridge further includes a membrane support mesh on the flexible membrane on the sample side of the flexible membrane.

Example 48 is a method of performing an assay that includes depositing a sample into a sample well of a sample cartridge, the sample well defined by a flexible membrane and a membrane frame having an opening sealed by the membrane frame, the flexible membrane having a sample side supporting the sample and an opposite sensor side, positioning the sample cartridge over a sensor surface such that the sensor side of the flexible membrane faces the sensor surface, displacing the flexible membrane toward the sensor surface such that the sample is moved to a position closer to the sensor surface, and imaging fluorescence emitted from the sensor with an optical imaging system when the sample is in the position closer to the sensor surface.

Example 49 includes the subject matter of Example 48, further including functionalizing the sample side of the flexible membrane to interact with the sample.

Example 50 includes the subject matter of any of Examples 48-49, wherein displacing the flexible membrane comprises displacing the flexible membrane to a distance at a center of the flexible membrane up to 100 µm.

Example 51 includes the subject matter of Example 50, wherein the distance at the center of the flexible membrane is up to 50 µm.

Example 52 includes the subject matter of any of Examples 48-51, wherein displacing the flexible membrane comprises displacing the flexible membrane to contact the sensor surface.

Example 53 includes the subject matter of any of Examples 48-52, wherein displacing the flexible membrane includes establishing a differential pressure between the sample side and the sensor side of the flexible membrane.

Example 54 includes the subject matter of Example 53, wherein establishing the differential pressure includes evacuating the sensor side of the flexible membrane.

Example 55 includes the subject matter of Example 54, wherein the differential pressure is in a range of between 0.1 kPa and 100 kPa.

Example 56 includes the subject matter of Example 55, wherein the differential pressure is in a range of between 0.1 kPa and 50 kPa.

Example 57 includes the subject matter of Example 56, wherein the differential pressure is in a range of between 1 kPa and 10 kPa.

Example 58 includes the subject matter of any of Examples 54-57, wherein evacuating the sensor side of the flexible membrane includes engaging the membrane frame with a gasket to form a seal around a perimeter of the membrane frame.

Example 59 includes the subject matter of Example 53, wherein establishing the differential pressure includes pressurizing the sample side of the flexible membrane.

Example 60 includes the subject matter of Example 59, wherein the differential pressure is in a range of between 0.1 kPa and 1000 kPa.

Example 61 includes the subject matter of Example 60, wherein the differential pressure is in a range of between 100 kPa and 1000 kPa.

Example 62 includes the subject matter of any of Examples 59-61, wherein pressurizing the sample side of the flexible membrane includes removably positioning a sample cartridge cap over the membrane frame to form a seal with the membrane frame, the sample cartridge cap including a window over at least a portion of the flexible membrane.

Example 63 includes the subject matter of any of Examples 59-61, wherein pressurizing the sample side of the flexible membrane includes removably engaging a flexible bladder with the sample cartridge to form a seal with the sample cartridge, the flexible bladder being disposed around an optical element of the optical imaging system.

Equivalents

Having thus described several illustrative embodiments, it is to be appreciated that various alterations, modifications, and improvements will readily occur to those skilled in the art. Such alterations, modifications, and improvements are intended to form a part of this disclosure and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions. Accordingly, the foregoing description and attached drawings are by way of example only, and are not intended to be limiting.

What is claimed is:

1. A sensor system comprising:
(a) a sensor having a sensor surface;
(b) a sample cartridge including one or more flexible membranes and a membrane frame, the membrane frame including one or more openings covered by the one or more flexible membranes defining one or more wells for holding one or more samples, the flexible membrane having a sample side supporting the sample and an opposite sensor side, the sample cartridge being removably insertable in the sensor system such that the sensor side of the flexible membrane is positioned above and faces the sensor surface;
(c) a displacement mechanism that can be actuated to displace the flexible membrane toward the sensor surface such that the sample is moved to a position closer to the sensor surface; and
(d) a camera system that detects light emitted from the sensor.

2. The system of claim 1, wherein the displacement mechanism is configured and arranged to create a differential pressure between the sample side and the sensor side of the flexible membrane, and the flexible membrane is configured and arranged to be displaceable away from the membrane frame to contact the sensor surface.

3. The system of claim 2, wherein the flexible membrane is sized to be displaceable away from the membrane frame to contact the sensor surface under the differential pressure between the sample side and the sensor side of the flexible membrane.

4. The system of claim 1, wherein the sensor surface is a nitrogen-vacancy (NV) diamond sensor surface, and the camera system images fluorescence emitted from the NV diamond sensor surface.

5. The system of claim 1, wherein the flexible membrane is functionalized on the sample side to interact with a sample.

6. The system of claim 1, wherein the flexible membrane is one of a silicon nitride flexible membrane, a crystalline silicon flexible membrane, a silicon dioxide flexible membrane, an amorphous carbon flexible membrane, a graphene flexible membrane, a boron nitride flexible membrane, a metal flexible membrane, or a polymer flexible membrane.

7. The system of claim 6, wherein the flexible membrane is a silicon nitride flexible membrane having a thickness in a range of between 30 nm and 500 nm.

8. The system of claim 7, wherein the thickness of the silicon nitride flexible membrane is 200 nm.

9. The system of claim 1, wherein the flexible membrane is displaceable to a distance at a center of the flexible membrane up to 100 μm away from the membrane frame.

10. The system of claim 9, wherein the flexible membrane is displaceable to a distance at a center of the flexible membrane up to 50 μm away from the membrane frame.

11. The system of claim 1, wherein the sample cartridge further includes a sample cartridge cap configured and arranged to overlay the membrane frame, the sample cartridge cap including a window over at least a portion of the flexible membrane.

12. The system of claim 11, wherein the sample cartridge cap includes a plurality of windows over a corresponding plurality of flexible membranes.

13. The system of claim 11, wherein the sample cartridge cap further includes a gas inlet for pressurizing the sample side of the flexible membrane.

14. The system of claim 13, wherein the differential pressure is in a range of between 0.1 kPa and 1000 kPa.

15. The system of claim 14, wherein the differential pressure is in a range of between 100 kPa and 1000 kPa.

16. The system of claim 1, wherein the sample cartridge further includes a membrane frame carrier secured to the membrane frame on the sample side of the flexible membrane.

17. The system of claim 16, wherein camera imaging system further includes a flexible bladder around an optical element of the camera system and a gas inlet for pressurizing the sample side of the flexible membrane, the flexible bladder configured and arranged to removably engage and form a seal with the membrane frame carrier.

18. The system of claim 17, wherein the differential pressure is in a range of between 0.1 kPa and 1000 kPa.

19. The system of claim 18, wherein the differential pressure is in a range of between 100 kPa and 1000 kPa.

20. The system of claim 16, wherein the membrane frame carrier is secured to a plurality of membrane frames.

21. The system of claim 20, wherein the plurality of membrane frames comprises 96 membrane frames.

22. The system of claim 21, wherein the membrane frame carrier is made of alumina having a thickness in a range of between 0.25 mm and 5 mm.

23. The system of claim 22, wherein the thickness of the membrane frame carrier is 1 mm.

24. The system of claim 1, wherein the sample cartridge further includes a membrane support mesh on the flexible membrane on the sample side of the flexible membrane.

25. The system of claim 1, wherein the displacement mechanism comprises a pneumatic actuator for displacing the membrane using differential pressure.

26. The system of 1, wherein the displacement mechanism comprises a hydraulic actuator.

27. The system of claim 1, wherein the displacement mechanism comprises a mechanical actuator.

28. The system of claim 1, wherein the displacement mechanism comprises an electrostatic actuator.

* * * * *